United States Patent
Nakamura et al.

(10) Patent No.: US 6,514,656 B1
(45) Date of Patent: *Feb. 4, 2003

(54) POSITIVE TYPE IMAGE FORMING MATERIAL

(75) Inventors: Ippei Nakamura, Shizuoka-ken (JP); Kazuto Kunita, Shizuoka-ken (JP)

(73) Assignee: Fuji Photo Film Co., Ltd., Minami-Ashigara (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/200,734

(22) Filed: Nov. 27, 1998

(30) Foreign Application Priority Data

Nov. 28, 1997 (JP) .............................................. 9-328937

(51) Int. Cl.⁷ .......................... G03F 7/021; G03F 7/023; G03F 7/039
(52) U.S. Cl. ....................... 430/157; 430/176; 430/191; 430/192; 430/193; 430/280.1; 430/281.1; 430/905; 430/926; 430/270.1
(58) Field of Search .............................. 430/270.1, 905, 430/281.1, 926, 280.1, 191, 192, 193, 176, 157

(56) References Cited

U.S. PATENT DOCUMENTS

| | | | | |
|---|---|---|---|---|
| 5,070,001 A | * | 12/1991 | Stahlhofen | 430/281.1 |
| 5,399,456 A | | 3/1995 | Spak et al. | 430/165 |
| 5,965,319 A | * | 10/1999 | Kobayashi | 430/176 |
| 6,190,829 B1 | * | 2/2001 | Holmes et al. | 430/270.1 |
| 6,284,439 B1 | * | 9/2001 | Holmes et al. | 430/325 |

FOREIGN PATENT DOCUMENTS

| | | |
|---|---|---|
| EP | 140376 | 5/1985 |
| EP | 628599 | 12/1994 |
| JP | 7285275 | 10/1995 |
| JP | 10-39509 | 2/1998 |
| WO | WO97/39894 | 10/1997 |

\* cited by examiner

*Primary Examiner*—John S. Chu
(74) *Attorney, Agent, or Firm*—Burns, Doane, Swecker & Mathis, LLP

(57) ABSTRACT

The present invention relates to a positive type image forming material comprising A: an alkali-aqueous-solution-soluble polymer compound having a phenolic hydroxyl group, B: a light and heat decomposing compound which suppresses alkali-aqueous-solution-solubility of said alkali-aqueous-solution-soluble polymer compound (A) having a phenolic hydroxyl group and is decomposed by light or heat to lose its alkali-aqueous-solution-solubility-suppressing effect on said compound (A), and C: a cross-linkable compound which increases said solubility-suppressing effect of said compound (B) when used together with said component (B) in a composition containing the alkali-aqueous-solution-soluble polymer compound (A) having a phenolic hydroxyl group, and which has in its molecule two or more cross-linkable groups which are cross-linked with the alkali-aqueous-solution-soluble polymer compound (A) with heating. This positive type image forming material is suitable for producing a planographic printing plate, which can be directly image-formed by a solid-state laser, semiconductor laser or the like, has excellent image forming property, and has excellent durability in printing.

35 Claims, No Drawings

POSITIVE TYPE IMAGE FORMING MATERIAL

BACKGROUND OF THE INVENTION

1 Field of the Invention

The present invention relates to a positive type image forming material. More particularly, the present invention relates to a positive type image forming material which can be inscribed with a light such as a laser light, heat generated by irradiation with a laser light, heat imparted by a thermal heat and the like, as well as other means, and which is suitably used for a planographic printing plate. The present invention particularly relates to a positive type image forming material that is suitably used as a planographic printing plate wherein so-called direct production of a printing plate, is possible, using an infrared laser based on digital signals output from a computer or the like.

2 Description of the Related Art

In recent years, laser technologies have developed remarkably. In particular, high output and compact solid-state laser devices and semiconductor laser devices emitting infrared rays of a wavelength of 760 nm to 1,200 nm are readily available. These lasers are very useful as a light source for recording in the direct production of a printing plate from digital computer data. As an image recording (forming) material which can be recorded by such an infrared laser, there is a positive-type recording material described in E.P. No. 703499A1 in which a tetrahydropyranyl ester is used as an alkali-aqueous-solution-soluble polymer compound. Japanese Patent Application Laid-Open (JP-A) No. 310148/1996 describes positive type recording material which is subjected to abrasion with an ultraviolet laser. However, plate materials using these image-recording materials have problems in that when an image is formed, and printing is conducted after storage of the plate at high temperatures and high humidity, image-forming ability is reduced severely, and scratch resistance in an image portion is lowered.

There is also suggested a method in which image forming is conducted by an infrared ray laser on a positive type image forming material prepared by allowing an alkali-aqueous-solution-soluble polymer compound to contain an infrared ray absorbing agent and a substance which is capable of suppressing the solubility of the polymer compound in an alkali-aqueous-solution and is decomposed by light or heat (hereafter, this substance may be referred to as "light- and heat-decomposable substance").

However, when these kinds of image recording materials are used, decomposition of the above-described heat and light decomposing substance can not be sufficiently effected; in other words, release or disappearance of the alkali-aqueous-solution-solubility-suppressing effect can not be sufficiently conducted by a laser having such an extent of energy as used for image forming. Therefore, a large difference can not be achieved between the alkali-aqueous-solution-solubilities of the irradiated portion and that of the no-irradiated portion (that is, only low sensitivity is achieved). As a result, image formation may not be excellent. To solve these problems, reducing the amount added of the above-described light- and heat-decomposable substance has been considered. However, in this case, since the alkali-aqueous-solution-solubility-suppressing effect decreases in the no-irradiation portion as well. A large difference still can not be achieved between the alkali-aqueous-solution solubilities of the irradiated portion and the no-irradiated portion, and excellent image formation can not be expected.

SUMMARY OF THE INVENTION

The present invention has been created in view of the problems described above, and an object thereof is to provide a positive type image forming material having excellent image forming property and excellent durability in printing, wherein direct image production is possible with infrared-ray-emitting solid-state or semiconductor laser devices or the like, based on digital data output from a computer or the like.

The above-described object of the present invention can be realized through the positive type image forming material described below.

A positive type image forming material comprising

A: an alkali-aqueous-solution-soluble polymer compound having a phenolic hydroxyl group, B: a light and heat decomposing compound which suppresses alkali-aqueous-solution-solubility of said alkali-aqueous-solution-soluble polymer compound (A) having a phenolic hydroxyl group and is decomposed by light or heat to lose its alkali-aqueous-solution-solubility-suppressing effect on said compound (A), and C: a cross-linkable compound which increases said solubility-suppressing effect of said compound (B) when used together with said component (B) in a composition containing the alkali-aqueous-solution-soluble polymer compound (A) having a phenolic hydroxyl group, and which has in its molecule two or more cross-linkable groups which are cross-linked with the alkali-aqueous-solution-soluble polymer compound (A) with heating.

DESCRIPTION OF THE PREFERRED EMBODIMENTS

The present invention will be described in detail below. <Compound which Enhances Above-described Alkali-aqueous-solution-solubility-suppressing Effect (Hereafter Refered to Simply as the "Solubility-suppressing Effects") by Being Used Together with Above-described Component (B) in a Composition Containing Alkali-aqueous-solution-soluble Polymer Compound (A) Having a Phenolic Hydroxyl Group, and which Has in Its Molecule Two or More Cross-linkable Groups which are Cross-linked with Polymer Compound (A) with Heating>

First, a compound which enhances the above-described solution-suppressing effect by being used together with the above-described component (B) in a composition containing the alkali-aqueous-solution-soluble polymer compound (A) having a phenolic hydroxyl group, and which has in its molecule two or more cross-linkable groups which are cross-linked with the polymer compound (A) with heating (hereafter, referred to simply as a "cross-linkable compound (C)"), will be explained as a feature of the present invention.

This cross-linkable compound (C) is a substance which is added to improve the sensitivity of the positive type image forming material of the present invention, and which has a capacity of enhancing the solubility-suppressing effect of the light- and heat-decomposable substance (B). However, this cross-linkable compound does not itself have a capacity of substantially suppressing the alkali-aqueous-solution-solubility of the alkali-aqueous-solution-soluble polymer compound (A). When an image forming material containing the light- and heat-decomposable substance (B) and this cross-linkable compound (C) is irradiated with an infrared laser light, the light- and heat-decomposable substance (B)

is decomposed and its solubility-suppressing effect disappears, while the cross-linkable compound (C) itself does not become a factor suppressing the alkali-aqueous-solution-solubility of the compound (A) at a laser-irradiated portion since the compound (C) does not have a solubility-suppressing effect.

On the other hand, at a non-laser-irradiated portion, the solubility-suppressing effect is enhanced more than it would be when only the light- and heat-decomposable substance (B) is used, due to interaction between the cross-linkable compound (C) and the light- and heat-decomposable substance (B).

The cross-linkable compound (C) in the present invention contains in its molecule a hetero atom, and can effect interaction such as hydrogen bond formation and ionic interaction and the like, with both the alkali-aqueous-solution-soluble polymer compound (A) and the substance (B) which is decomposed by light or heat to lose the above-described solubility-suppressing effect. Thus, the above-described solubility-suppressing effect is enhanced. The hetero atom contained in the cross-linkable compound (C) is not particularly restricted providing it is a hetero atom that can effect interaction such as hydrogen bond formation and ionic interaction and the like. In the present invention, atoms such as nitrogen, oxygen, fluorine, chlorine, bromine and the like having high electronegativity are preferable as this hetero atom, and nitrogen and oxygen are particularly preferable. As a substituent that contains a hetero atom such as nitrogen, oxygen or the like, and exhibits the above-described interaction, an ether bond, amide bond, sulfonamide bond, ester bond, hydroxyl group and the like are listed as examples.

Therefore, the difference in the alkali-aqueous-solution-solubilities of the laser-irradiated portion and the non-laser-irradiated portion is even bigger than that in a case in which only the light- and heat-decomposable substance is added, and sensitivity of the image forming material increases.

Further, since the cross-linkable compound (C) in the present invention contains in its molecule two or more cross-linkable groups which effect a cross-linking reaction with an alkali-aqueous-solution-soluble polymer compound (A) having a phenolic hydroxyl group, when heating is conducted (burning treatment) after alkali-developing, the alkali-aqueous-solution-soluble polymer compound having a phenolic hydroxyl group is cross-linked and cured, and the strength of a coated portion of the no-irradiated portion increases. Therefore, in a case in which the positive type image forming material of the present invention is applied on the printing plate, the printing resistance thereof significantly increases with the burning treatment conducted after developing.

As such cross-linkable groups, a condensation-cross-linkable substituent and a polymerizable substituent are listed as examples, and examples of the condensation-cross-linkable substituent include a substituted or unsubstituted hydroxymethyl group, substituted or unsubstituted alkoxymethyl group, substituted or unsubstituted aryloxymethyl group and the like. Regarding examples of the polymerizable substituent, as the cation-polymerizable substituent, there are listed cation-polymerizable substituents hold by cation-polymerizable compounds described in Table 1.1 in Toshinobu Higashimura, "Lecture, Polymerization Reaction Theory <3> Cation Polymerization (Kagaku Dojin)", such as, an ethylenic double bond, epoxy group, vinyl ether group and the like, and as the radical-polymerizable substituent, there are listed as examples an ethylenic double bond and the like.

Among these, the condensation-cross-linkable substituent and the cation-polymerizable substituent are preferable, and a hydroxymethyl group, alkoxymethyl group, ethylenic-double bond, epoxy group and the like are particularly preferably listed.

Further, in the present invention, since the amount added of the light- and heat-decomposable substance (B) can be reduced as compared with the case in which the light- and heat-decomposable substance is used alone by adding the cross-linkable compound (C), the difference in the alkali-aqueous-solution-solubilities of the laser-irradiated portion and the non-laser-irradiated portion can be increased even when image forming is effected using an infrared ray laser having a relatively low energy level. Accordingly, excellent sensitivity can be obtained.

Particularly preferable compounds that can be used as such cross-linkable compounds are listed below.

I-1

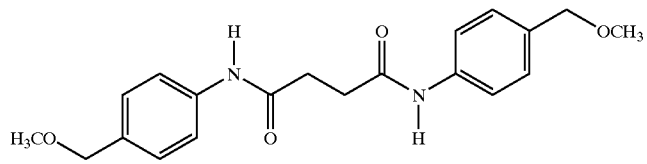

I-2

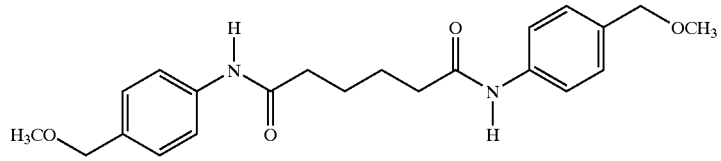

I-3

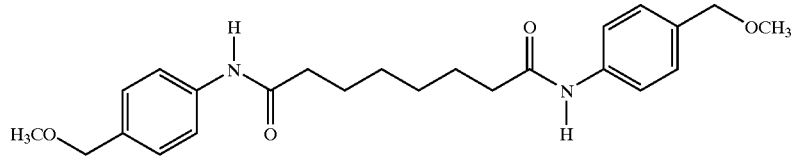

I-4
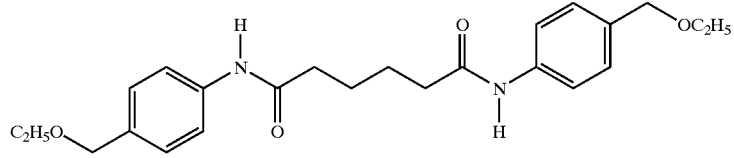
I-5
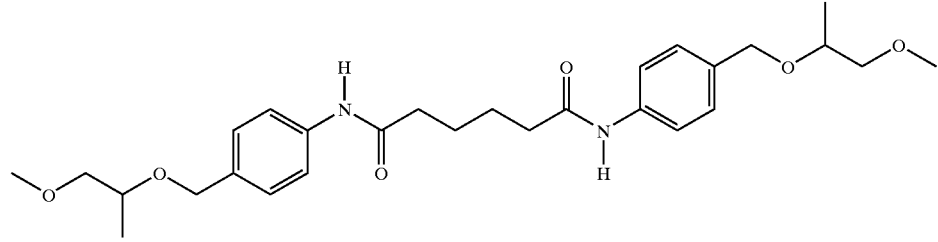
I-6
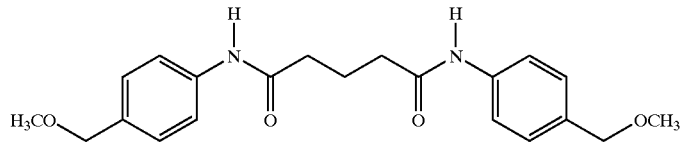
I-7
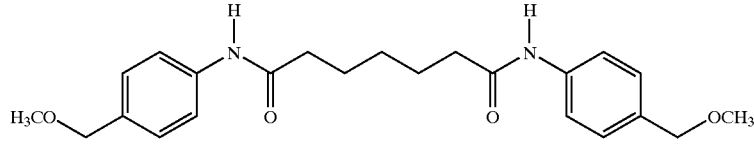
I-8
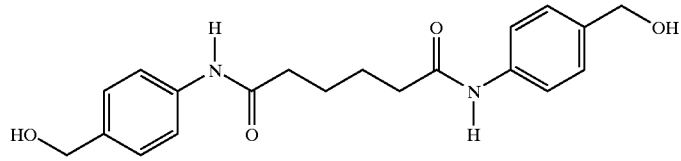
I-9
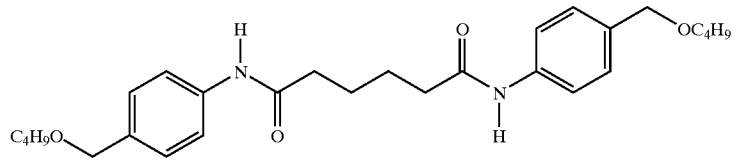
I-10  I-11
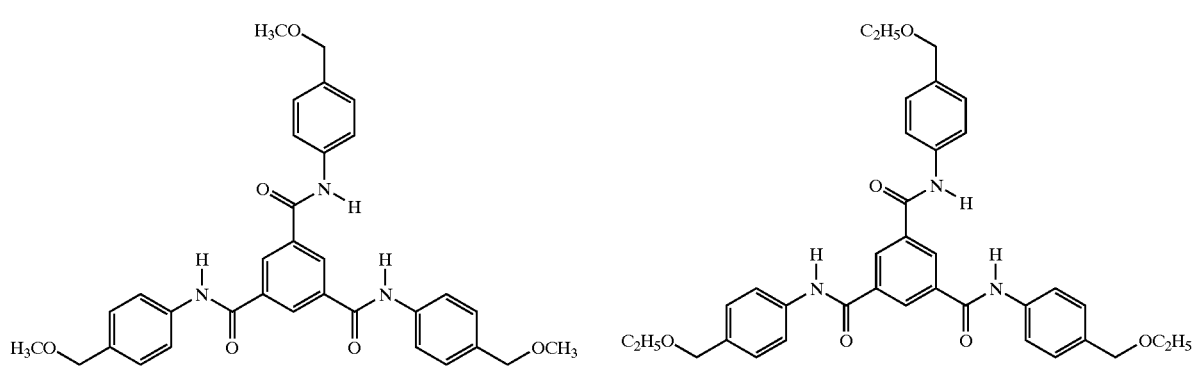
I-12  I-13
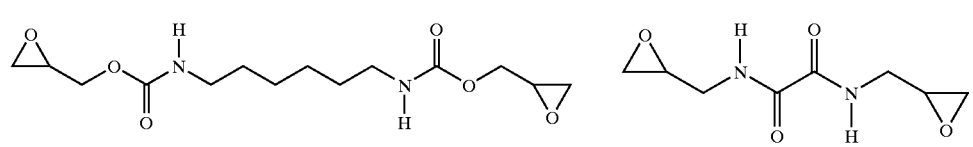

-continued
I-14
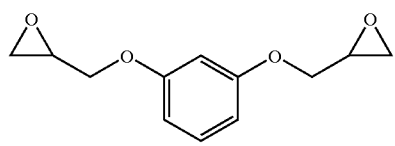
I-15
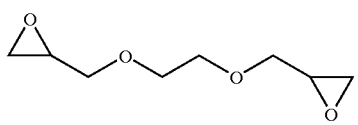
I-16
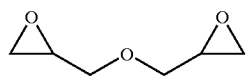
I-17
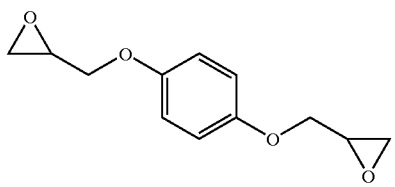
I-18
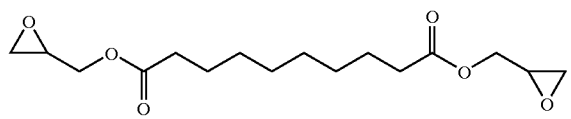
I-19
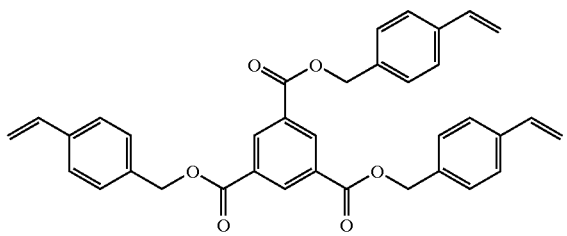
I-20
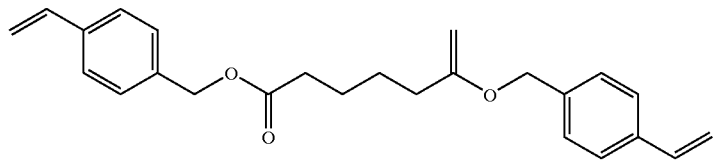
I-21
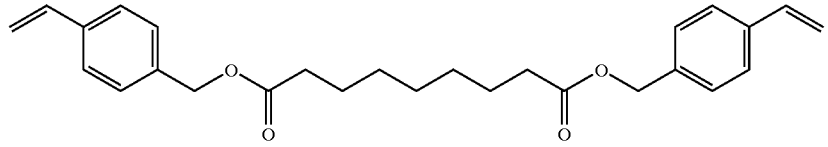
I-22
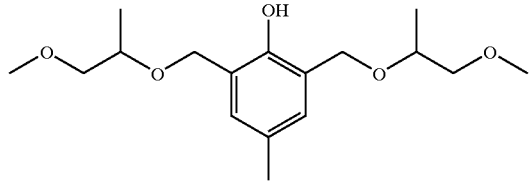
I-23
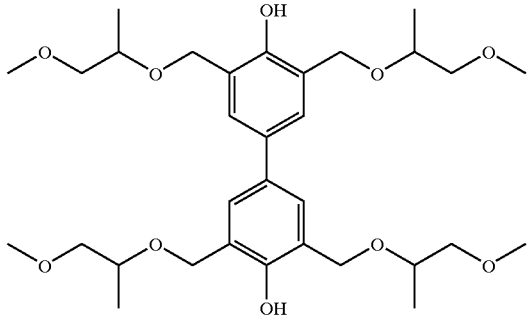
I-24
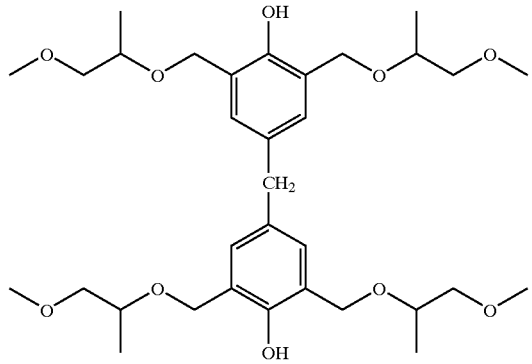

In the present invention, the cross-linkable compound is used in an amount of 5 to 70% by weight, preferably 10 to 65% by weight, of the total weight of the solid components in the image forming material. When the amount added of the cross-linkable compound is less than 5% by weight, the film strength deteriorates in the image portion after recording an image, and when over 70% by weight, developing performance becomes unpreferable. Further, because of the same reason, it is preferable to add the cross-linkable compound in an amount of from 5 to 80% by weight of the light- and heat-decomposable substance.

In the present invention, the cross-linkable compound may be used alone or in combinations of two or more.

<Alkali-aqueous-solution-soluble Polymer Compound Having a Phenolic Hydroxyl Group>

Next, the alkali-aqueous-solution-soluble polymer compound having a phenolic hydroxyl group used in the present invention will be described.

The alkali-aqueous-solution-soluble polymer compound having a phenolic hydroxyl group in the present invention is a polymer compound that forms an image via the following mechanism: its laser-irradiated portion becomes soluble in the alkali developer and is removed from the printing plate since the above-described component (B) is decomposed and the solubility-suppressing effect is lost, while its non-laser-irradiated portion remains on the printing plate since it is not dissolved in the alkali developer because of interaction with the above-described components (B) and (C), as explained below.

As the alkali-aqueous-solution-soluble polymer compound having a phenolic hydroxyl group in the present invention, the following substances are preferably used in terms of plate durability and adhesion to a substrate: novolak resins such as a phenol formaldehyde resin, m-cresol formaldehyde resin, p-cresol formaldehyde resin, m-/p-mixed cresol formaldehyde resin and the like; polyhydroxystyrenes, hydroxystyrene-N-substituted maleimide copolymer, hydroxystyrene-maleic anhydride copolymer and the like.

As the alkali-aqueous-solution-soluble polymer compound having a phenolic hydroxyl group in the present invention, a polymer compound having a weight-average molecular weight from 1,000 to 1,000,000 is preferable, and a compound having a weight-average molecular weight from 2,000 to 300,000 is more preferable. When the weight-average molecular weight is less than 1,000, a disadvantage of decreased plate durability in printing occurs, and when over 1,000,000, developing performance is not preferable.

In the present invention, the alkali-aqueous-solution-soluble polymer compound is used in an amount of 10 to 90% by weight, preferably 20 to 85% by weight, and particularlypreferably 30 to 80% by weight, of the total weight of the solid components in the positive type image forming material. When the amount added of the alkali-aqueous-solution-soluble polymer compound is less than 10% by weight, durability of a recording layer deteriorates, and when over 90% by weight, sensitivity and durability are not preferable. These alkali-aqueous-solution-soluble polymer compounds may be used alone or in combinations of two or more.

<Compound that is Capable of Suppressing Alkali-aqueous-solution-solubility of Alkali-aqueous-solution-soluble Polymer Compound Having a Phenolic Hydroxyl Group and is Decomposed by Light or Heat to Lose Above-described Solubility-suppressing Effect>

Next, the compound that is capable of suppressing the alkali-aqueous-solution-solubility of an alkali-aqueous-solution-soluble polymer compound having a phenolic hydroxyl group and is decomposed by light or heat to lose the above-described solubility-suppressing effect ("light- and heat-decomposable substance") used in the present invention will be described. Since this substance loses its "solubility-suppressing effect", when decomposed by light or heat, the laser-irradiated portion of the positive type image forming material becomes soluble in the alkali developer, while in the non-laser-irradiated portion, this substance still suppresses the alkali-aqueous-solution-solubility of the alkali-aqueous-solution-soluble polymer compound. Accordingly, an image is formed on the printing plate by developing due to the difference in the alkali-aqueous-solution-solubilities of the two portions.

As the light- and heat-decomposable substance, there can also be suitably used a substance which is decomposed by light or heat to generate an acid. In this case, in the laser-irradiated portion of the positive type image forming material, the light- and heat-decomposable substance is decomposed to lose the alkali-aqueous-solution-solubility-suppressing effect and at the same time the substance generates an acid. As a result, the alkali-aqueous-solution-solubility of the this portion of the plate further increases.

As the substance that is decomposed by light and heat to generate an acid, the following examples are listed.

Diazonium salts described in S. I. Schlesinger, Photogr. Sci. Eng., 18, 387 (1974), T. S. Bal et al., Polymer, 21, 423 (1980) and the like; ammonium salts described in U.S. Pat. Nos. 4,069,055, 4,069,056, U.S. Reissued Pat. No. 27, 992, JP-A No. 4-365,049; phosphonium salts described in D. C. Necker et al., Macromolecules, 17, 2468 (1984), C. S. Wen et al., Tech, Proc. Conf. Rad. Curing ASIA, p478, Tokyo, October (1988), U.S. Pat. Nos. 4,069,055, 4,069,056; iodonium salts described in J. V. Crivello et al., Macromolecules, 10 (6), 1307 (1977), Chem. & Eng. News, November 28, p31 (1988), EP No. 104,143, U.S. Pat. Nos. 339,049, 410, 201, JP-A Nos. 2-150,848, 2-296,514; sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), EP Nos. 370,693, 3,902,214, 233,567, 297,443 and 297,442, U.S. Pat. Nos. 4,933,377, 161,811, 410,201, 339,049, 4,760,013, 4,734,444, 2,833,827, German Patent Nos. 2,904,626, 3,604,580, 3,604,581; selenonium salts described in J. V. Crivello et al., Macromolecules, 10 (6), 1307 (1977), J. V. Crivello et al., J. Polymer Sci., Polymer Chem. Ed., 17, 1047 (1979); onium salts such as an arsonium salt and the like described in C. S. Wen et al., Tech, Proc. Conf. Rad. Curing ASIA, p478, Tokyo, October (1988) ; organic halogen compounds described in U.S. Pat. No. 3,905,815, Japanese Patent Application Publication (JP-B) No. 46-4,605, JP-A Nos. 48-36,281, 55-32,070, 60-239, 736, 61-169,835, 61-169,837, 62-58,241, 62-212,401, 63-70,243, 63-298,339; organometal/organic halogen compounds described in K. Meier et al., J. Rad. Curing, 13 (4), 26 (1986), T. P. Gill et al., Inorg. Chem., 19, 3007 (1980), D. Astruc, Acc. Chem. Res., 19 (12), 377 (1896), JP-A No. 2-161,445; photo- and heat-decomposable (decomposing) substances having an O-nitrobenzyl type protecting group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M.

Collins et al., J. Chem. Soc., Perkin I, 1965 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), EP Nos. 0,290,750, 046,083, 156,535, 271,851, 0,388,343, U.S. Pat. Nos. 3,901,710, 4,181,531, JP-A Nos. 60-198,538, 53-133,022; compounds which are photo-decomposed to generate sulfonic acid represented by iminosulfonate and the like described in M. TUNOOKA et al., Polymer Preprints Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), EP Nos. 0,199,672, 84,515, 199,672, 044,115, 0,101, 122, U.S. Pat. Nos. 4,618,564, 4,371,605, 4,431,774, JP-A Nos. 64-18,143, 2-245,756, JP-A No. 3-140,109; disulfone compounds described in JP-A No. 61-166,544, 1,2-quinonediazide compounds represents by 1,2-naphthoquinonediazide sulfonic acid ester described in described in JP-B No. 43-28,403, and the like.

Further, there can also be used compounds obtained by introducing these groups or compounds, which can generate an acid, into a main chain or a side chain of a polymer, for example, compounds described in M. E. Woodhous et al., J. Am. Chem. Soc., 1,045,586 (1982), S. P. Pappas et al., J. Imaging Sci., 30 (5), 218 (1986), S. Kondo et al., Macromol. Chem., Rapid Commun., 9, 625 (1988), Y. Yamada et al, Macromol. Chem., 152, 153, 163 (1972), J. V. Crivello et al., J. Polymer Sci., Polymer Chem. Ed., 17, 3845 (1979), U.S. Pat. No. 3,849,137, German Patent No. 3,914,407, and JP-A Nos. 63-26,653, 55-164,824, 62-69,263, 63-146,037, 63-163,452, 62-153,853 and 63-146,029.

Further, there can also be used compounds that generate an acid by the action of a light described in V. N. R. Pillai, Synthesis, (1), 1(1980), A. Abad et at, Tetrahedron Lett., (47) 4555 (1971), D. H. R. Barton et al., J. Chem, Soc., (C), 329 (1970), U.S. Pat. No. 3,779,778 and EP No. 126,712.

As the photo(light) and heat decomposing compound that generates an acid in the present invention, compounds represented by the following general formulae (1) to (7) are preferable, and among these, a diazonium salt and a quinonediazide compound are particularly preferable. The reason why a diazonium salt and a quinonediazide compound are particularly preferable as the light and heat decomposing compound in the present invention is that these compounds effects excellent interaction with the above-described component (C) ("cross-linkable compound") in the present invention.

[1] Disulfone derivatives represented by the following general formula (1) or imino sulfonate derivatives represented by the following general formula (2).

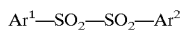

Ar$^1$—SO$_2$—SO$_2$—Ar$^2$       General formula (1)

General formula (2)

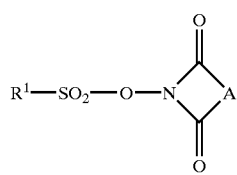

Wherein, Ar$^1$ and Ar$^2$ each independently represents a substituted or unsubstituted aryl group. R$^1$ represents a substituted or unsubstituted alkyl group or aryl group. "A" in the general formula (2) represents a substituted or unsubstituted alkylene group, alkenylene group or arylene group.

[2] Onium salt derivatives represented by the following general formulae (3), (4) and (5)

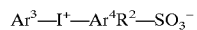

Ar$^3$—I$^+$—Ar$^4$R$^2$—SO$_3^-$       General formula (3)

General formula (4)

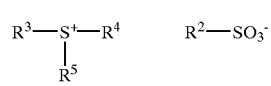

R$^3$—S$^+$—R$^4$       R$^2$—SO$_3^-$
   |
   R$^5$

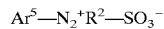

Ar$^5$—N$_2^+$R$^2$—SO$_3^-$       General formula (5)

In the above-described general formulae, R$^2$ represents a hydrocarbon group having 20 or less carbon atoms which may have a substituent.

Examples of the hydrocarbon group include: alkyl groups such as a methyl group, ethyl group, n-propyl group, i-propyl group, allyl group, n-butyl group, sec-butyl group, t-butyl group, hexyl group, cyclohexyl group, octyl group, 2-ethylhexyl group, dodecyl group and the like; alkenyl groups such as a vinyl group, 1-methylvinyl group, 2-phenylvinyl group and the like; aralkyl groups such as a benzyl group, phenethyl group and the like; and aryl groups such as a phenyl group, tolyl group, xylyl group, cumenyl group, mesityl group, dodecylphenyl group, phenylphenyl group, naphthyl group, anthracenyl group and the like.

These hydrocarbon groups may each have a substituent such as, for example, a halogen atom, hydroxyl group, alkoxy group, aryloxy group, nitro group, cyano group, carbonyl group, carboxyl group, alkoxycarbonyl group, anilino group, acetamide group and the like. Specific examples of the hydrocarbon having such a substituent include a trifluoromethyl group, 2-methoxyethyl group, 10-camphornyl, fluorophenyl group, chlorophenyl group, bromophenyl group, iodophenyl group, methoxyphenyl group, hydroxyphenyl group, phenoxyphenyl group, nitrophenyl group, cyanophenyl group, carboxyphenyl group, methoxynaphthyl group, dimethoxyanthracenyl group, diethoxyanthracenyl group, anthraquinonyl group and the like.

Ar$^3$, Ar$^4$ and Ar$^5$ each independently represents an aryl group, having 20 or less carbon atoms, which may have a substituent.

Specific examples thereof include a phenyl group, tolyl group, xylyl group, cumenyl group, mesityl group, dodecylphenyl group, phenylphenyl group, naphthyl group, anthracenyl group, fluorophenyl group, chlorophenyl group, bromophenyl group, iodophenyl group, methoxyphenyl group, hydroxyphenyl group, phenoxyphenyl group, nitrophenyl group, cyanophenyl group, carboxyphenyl group, anilinophenyl group, anilinocarbonylphenyl group, morpholinophenyl group, phenylazophenyl group, methoxynaphthyl group, hydroxynaphthyl group, nitronaphthyl group, anthraquinonyl group and the like.

R$^3$, R$^4$ and R$^5$ each independently represents a hydrocarbon group, having 18 or less carbon atoms, which may have a substituent.

Specific examples thereof include hydrocarbon groups such as a methyl group, ethyl group, n-propyl group, i-propyl group, allyl group, n-butyl group, sec-butyl group, t-butyl group, hexyl group, cyclohexyl group, benzyl group, phenyl group, tolyl group, t-butylphenyl group, naphthyl group, anthracenyl group and the like, and hydrocarbon groups having a substituent such as 2-methoxyethyl group, fluorophenyl group, chlorophenyl group, bromophenyl group, iodophenyl group, methoxyphenyl group, hydroxyphenyl group, phenylthiophenyl group, hydroxynaphthyl group, methoxynaphthyl group, benzoyl methyl group, naphthoylmethyl group and the like.

$R^3$ and $R^4$ may bond with each other to form a ring.

As the cation portion of the onium salt represented by the general formulae (3) to (5), an iodonium ion, sulfonium ion and diazonium ion represented by the following structures are specifically listed.

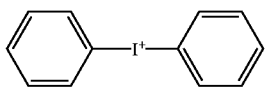
(6-1)

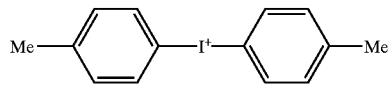
(6-2)

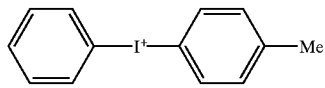
(6-3)

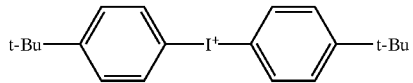
(6-4)

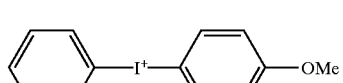
(6-5)

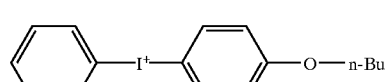
(6-6)

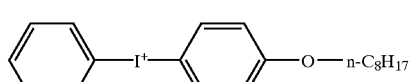
(6-7)

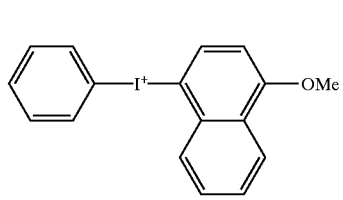
(6-8)

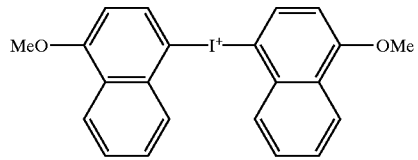
(6-9)

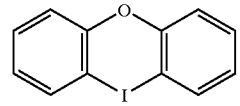
(6-10)

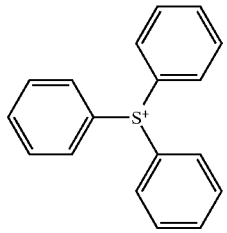
(7-1)

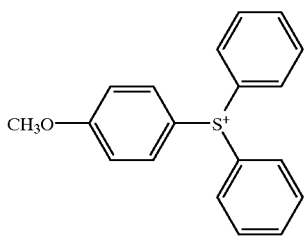
(7-2)

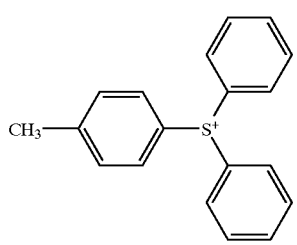
(7-3)

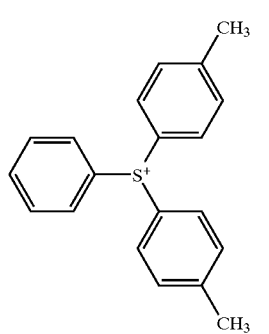
(7-4)

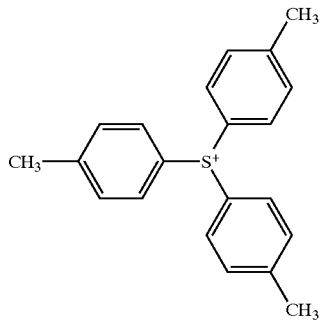
(7-5)

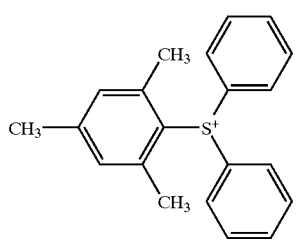
(7-6)

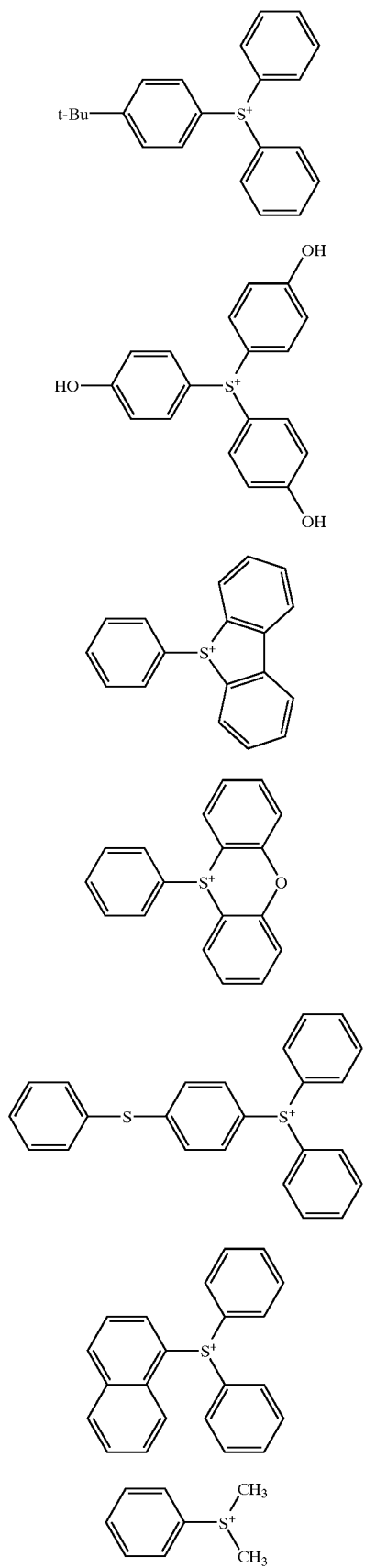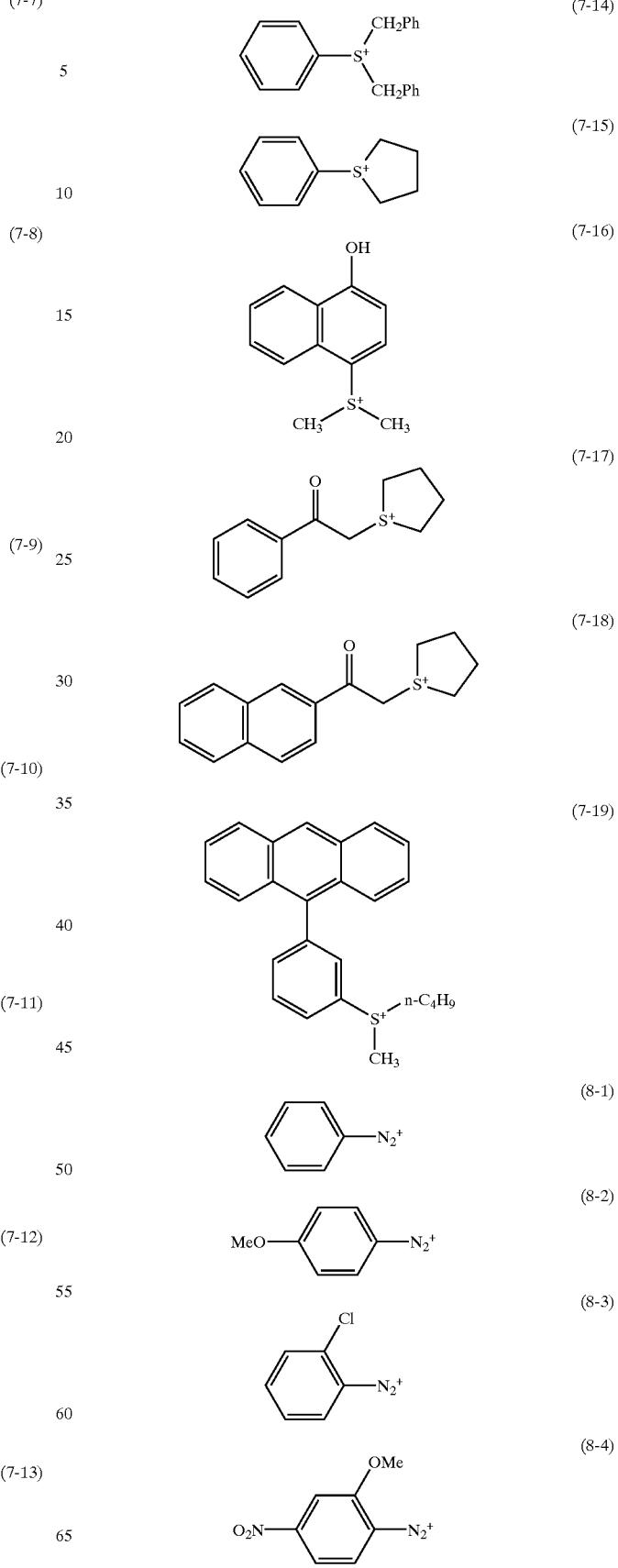

-continued
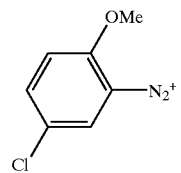 (8-5)
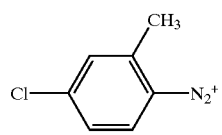 (8-6)
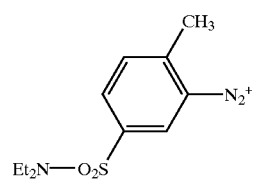 (8-7)
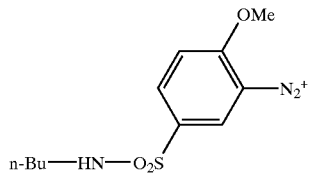 (8-8)
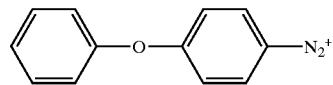 (8-9)
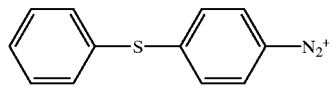 (8-10)
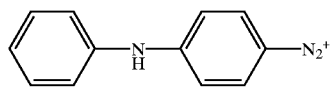 (8-11)
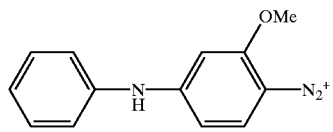 (8-12)
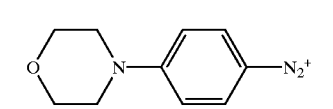 (8-13)
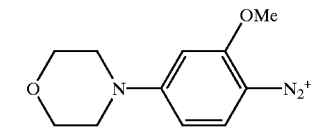 (8-14)
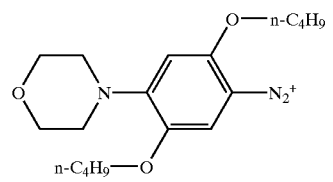 (8-15)
-continued
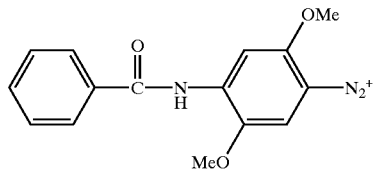 (8-16)
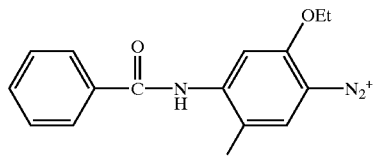 (8-17)
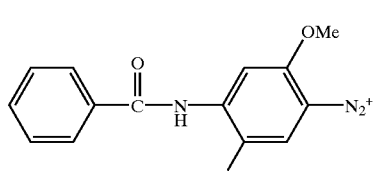 (8-18)
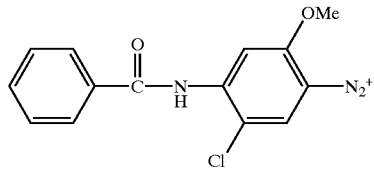 (8-19)
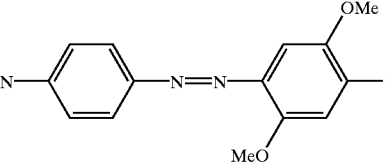 (8-20)
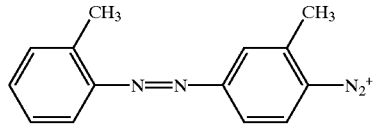 (8-21)
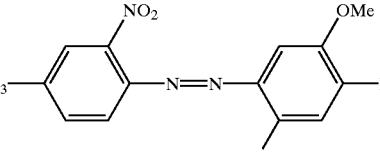 (8-22)
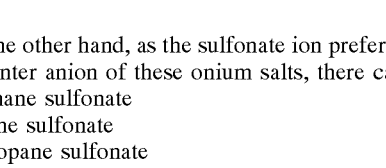 (8-23)
On the other hand, as the sulfonate ion preferably used as the counter anion of these onium salts, there can be used
1) methane sulfonate
2) ethane sulfonate
3) 1-propane sulfonate
4) 2-propane sulfonate
5) n-butane sulfonate
6) allyl sulfonate 7) 10-camphor sulfonate
8) trifluoromethane sulfonate
9) pentafluoroethane sulfonate
10) benzene sulfonate
11) p-toluene sulfonate
12) 3-methoxybenzene sulfonate
13) 4-methoxybenzene sulfonate
14) 4-hydroxybenzene sulfonate
15) 4-chlorobenzene sulfonate
16) 3-nitrobenzene sulfonate
17) 4-nitrobenzene sulfonate
18) 4-acetylbenzene sulfonate
19) pentafluorobenzene sulfonate
20) 4-dodecylbenzene sulfonate
21) mesitylene sulfonate
22) 2,4,6-triisopropyl benzene sulfonate
23) 2-hydroxy-4-methoxybenzophenone-5-sulfonate
24) dimethyl isophthalate-5-sulfonate
25) diphenyl amine-4-sulfonate
26) 1-naphthalene sulfonate
27) 2-naphthalene sulfonate
28) 2-naphthol-6-sulfonate
29) 2-naphthol-7-sulfonate
30) anthraquinone-1-sulfonate
31) anthraquinone-2-sulfonate
32) 9,10-dimethoxyanthracene-2-sulfonate
33) 9,10-diethoxyanthracene-2-sulfonate
34) quinoline-8-sulfonate
35) 8-hydroxyquinoline-5-sulfonate
36) 8-anilino-naphthalene-1-sulfonate and also salts each comprising a disulfonate and an onium salt having 2 equivalent cations may also be used. Examples of such disulfonates include:

41) m-benzene disulfonate
42) benzaldehyde-2,4-disulfonate
43) 1,5-naphthalene disulfonate
44) 2,6-naphthalene disulfonate
45) 2,7-naphthalene disulfonate
46) anthraquinone-1,5-disulfonate
47) anthraquinone-1,8-disulfonate
48) anthraquinone-2,6-disulfonate
49) 9,10-dimethoxyanthracene-2,6-disulfonate
50) 9,10-diethoxyanthracene-2,6-disulfonate
and the like.

The onium salt sulfonate preferably used in the present invention can be obtained by mixing a corresponding Kurrol's salt and the like with sulfonic acid, sodium or potassium sulfonate, in water, or in a mixed solvent of water and a hydrophilic solvent such as alcohol and the like and thus effecting a salt-exchange process.

The synthesis of such onium compounds can be conducted by a known method. For example, they can be synthesized by methods described, "Shin Jikken Kagaku Koza, vol. 14-I, chapter 2.3, (p. 448)", Published by Maruzen, vol 14-III, chapter 8.16 (p. 183) of the same, chapter 7.14 (p. 1564) of the same, J. W. Knapczyk and the like, J. Am. Chem. Soc., vol. 91, 145 (1969), A. L. Maycok et al. , J. Org. Chem. , vol. 35, 2532 (1970), J. V. Crivello et al., Polym. Chem. Ed., vol. 18, 2677 (1980), U.S. Pat. Nos. 2,807,648 and 4,247,473, JP-A No. 53-101,331, JP-B No. 5-53,166 and the like.

[3] Diazo compounds such as 1,2-naphthoquinonediazidesulfonic acid derivatives represented by general formulae (6) and (7) described below.

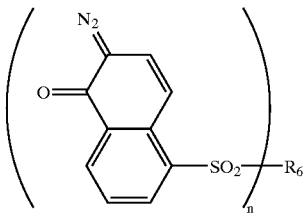

General formula (6)

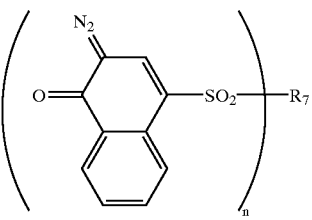

General formula (7)

In the formulae, $R^6$ and $R^7$ each represent an organic group, having a valency of one or more, which may have a substituent, and $R^6$ or $R^7$ is connected with a sulfonyl part by an ester or amide bond. n represents an integer of 1 or more. When diazo compounds of the following compounds are used, useful positive type image forming materials are formed.

Specific examples of the disulfone derivative represented by the above-described general formula (1) or the iminosulfonate derivative represented by the general formula (2) are listed below as non-limiting examples.

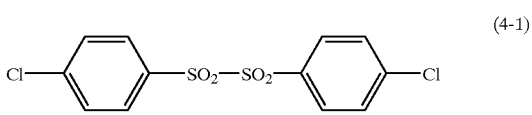

(4-1)

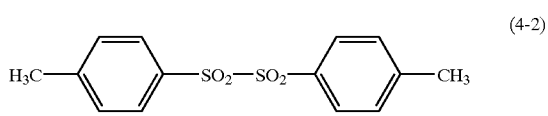

(4-2)

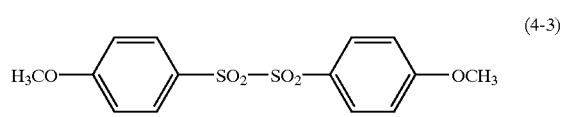

(4-3)

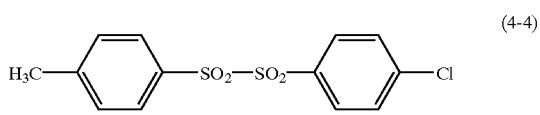

(4-4)

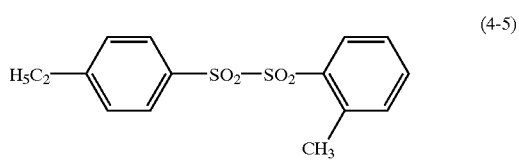

(4-5)

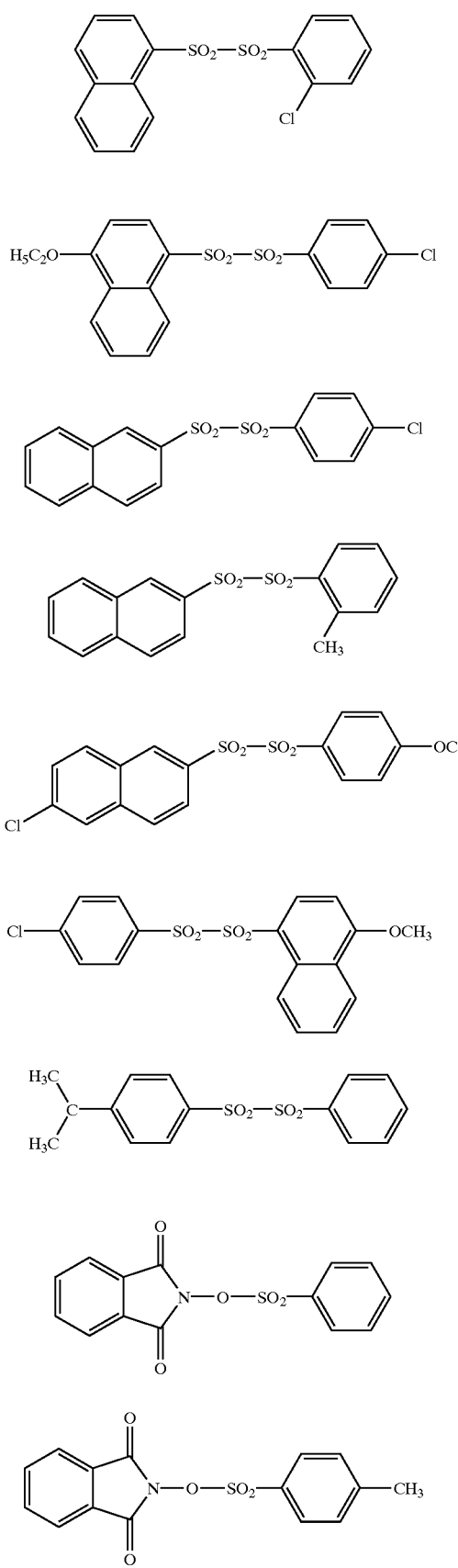
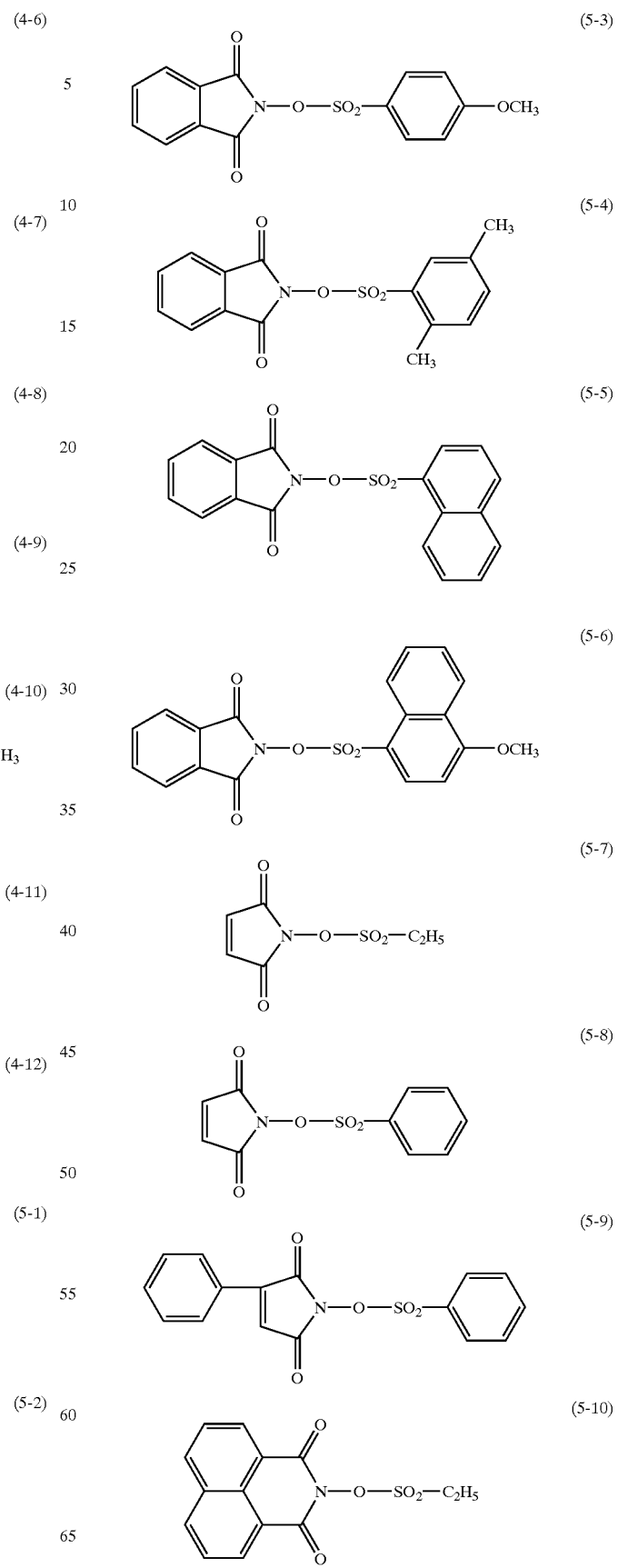

-continued (5-11) [structure: naphthalimide-N-O-SO₂-(CH₂)₁₅-CH₃]

(5-12) [structure: naphthalimide-N-O-SO₂-phenyl]

Next, particularly preferable specific examples of the onium salts represented by the above-described general formulae (3) to (5) are listed below as non-limiting examples.

(6-1-1) Ph₂I⁺  CH₃—SO₃⁻

(6-1-7) Ph₂I⁺  [camphorsulfonate]

(6-1-8) Ph₂I⁺  CF₃—SO₃⁻

(6-1-11) Ph₂I⁺  ⁻O₃S—C₆H₄—CH₃

(6-1-13) Ph₂I⁺  ⁻O₃S—C₆H₄—OCH₃

(6-1-17) Ph₂I⁺  ⁻O₃S—C₆H₄—NO₂

(6-1-20) Ph₂I⁺  ⁻O₃S—C₆H₄—n-C₁₂H₂₅

(6-1-27) Ph₂I⁺  ⁻O₃S—naphthyl

-continued (6-1-31) Ph₂I⁺  ⁻O₃S-anthraquinone (6-1-32) Ph₂I⁺  ⁻O₃S-(9,10-dimethoxyanthracene)

(6-1-33) Ph₂I⁺  ⁻O₃S-(9,10-diethoxyanthracene)

(6-1-36) Ph₂I⁺  [8-(phenylamino)-naphthalene-1-sulfonate with SO₃⁻]

(6-1-50) (Ph₂I⁺)₂  [9,10-diethoxyanthracene-2,6-disulfonate]

(6-4-8) (t-Bu-C₆H₄)₂I⁺  CF₃—SO₃⁻

(6-5-8) Ph-I⁺-C₆H₄-OMe  CF₃—SO₃⁻

(6-7-8) Ph-I⁺-C₆H₄-O-n-C₈H₁₇  CF₃—SO₃⁻

(6-7-11)
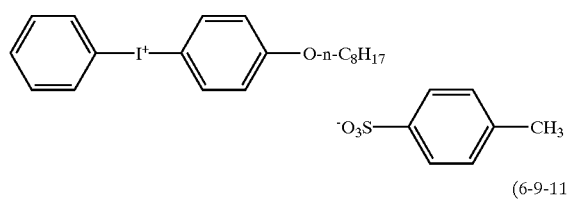
(6-9-11)
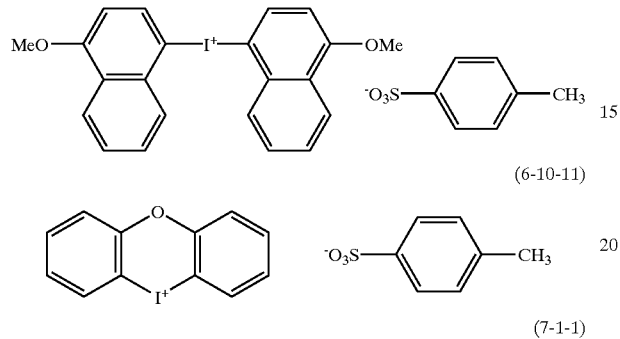
(6-10-11)
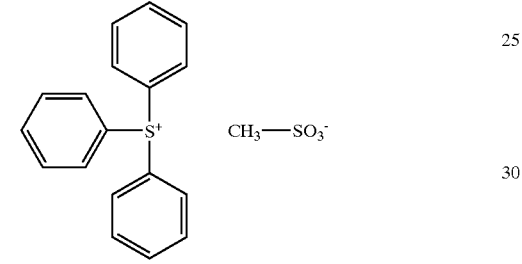
(7-1-1)
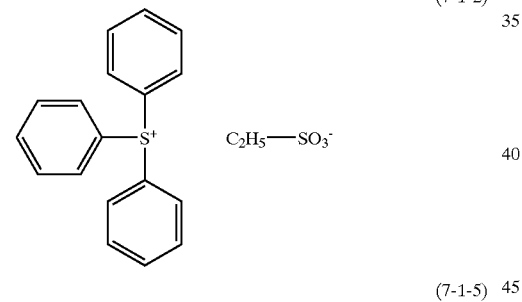
(7-1-2)
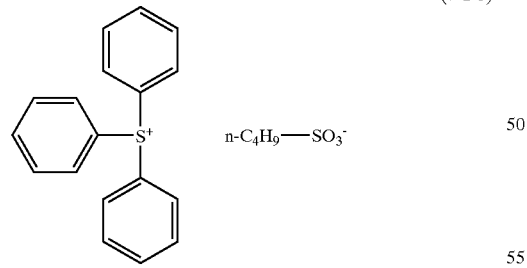
(7-1-5)
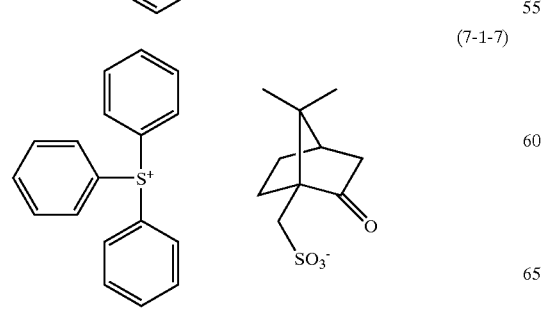
(7-1-7)
(7-1-8)
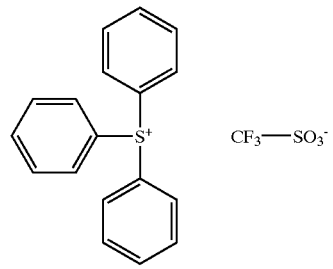
(7-1-10)
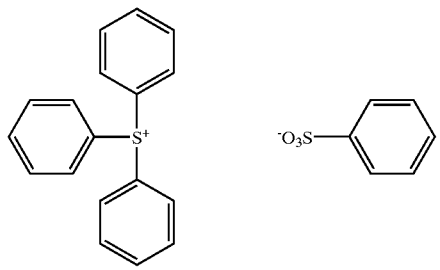
(7-1-11)
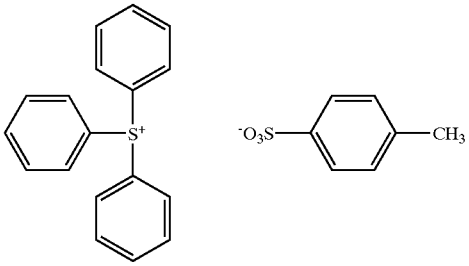
(7-1-13)
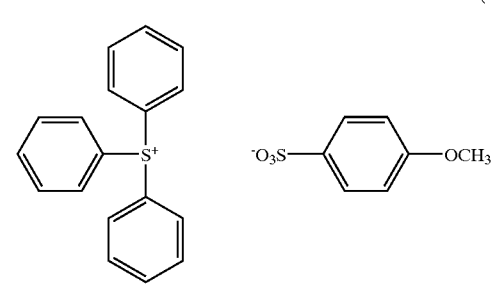
(7-1-15)
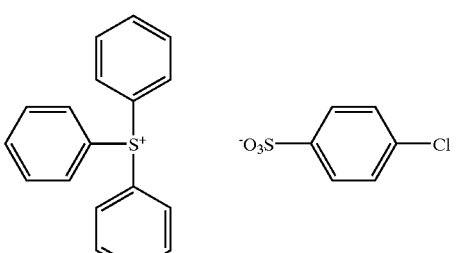
(7-1-17)
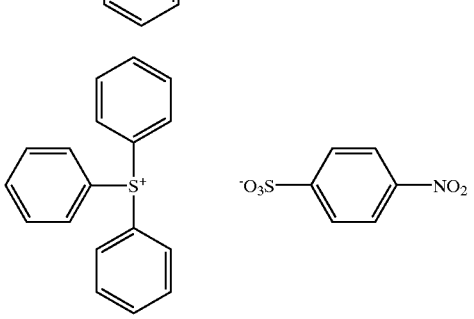

(7-1-20) 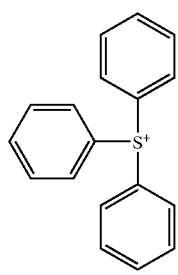 
(7-1-21) 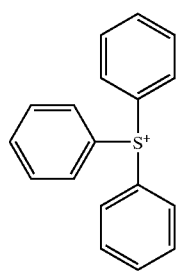 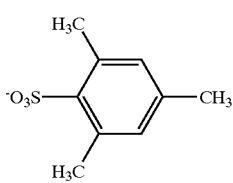
(7-1-22) 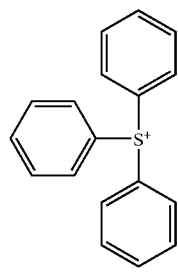 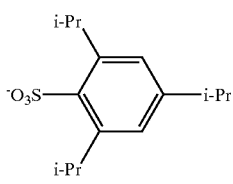
(7-1-23) 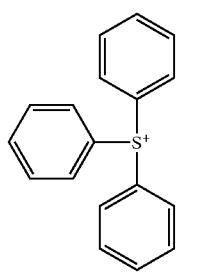 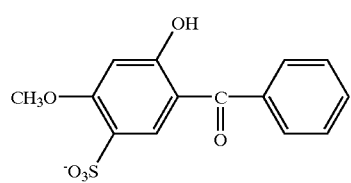
(7-1-26) 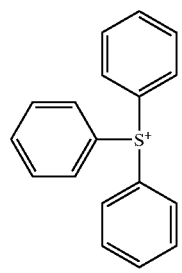 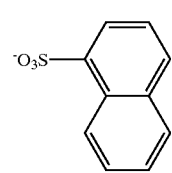
(7-1-27) 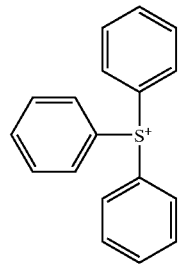 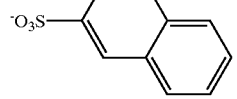
(7-1-31) 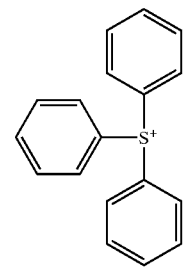 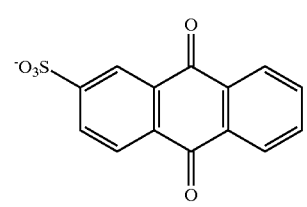
(7-1-32) 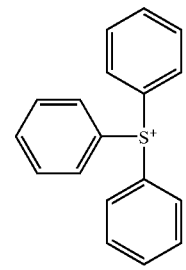 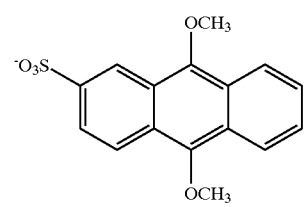
(7-1-33) 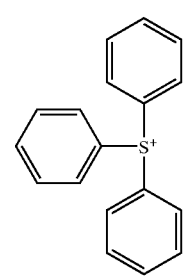 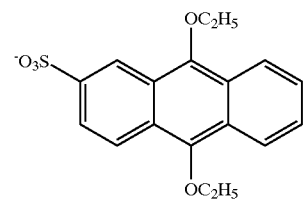
(7-2-8) 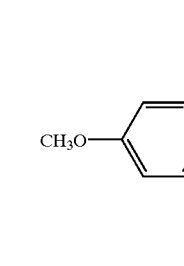 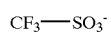

(7-3-8)
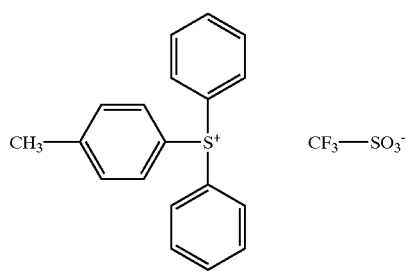
(7-4-8)
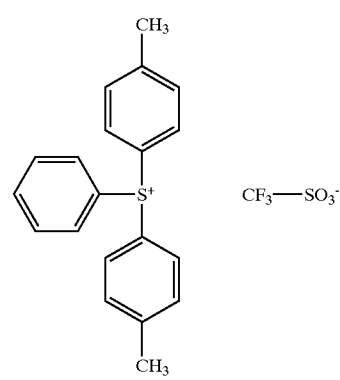
(7-5-8)
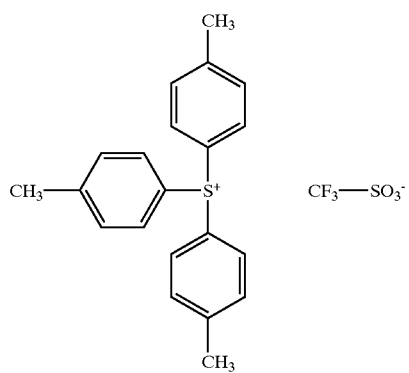
(7-6-8)
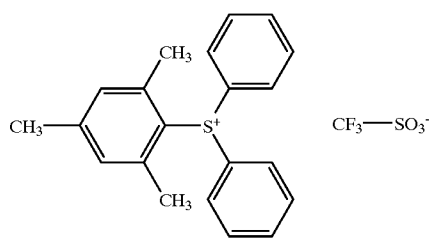
(7-7-8)
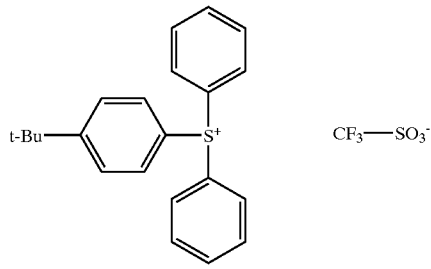
(7-8-8)
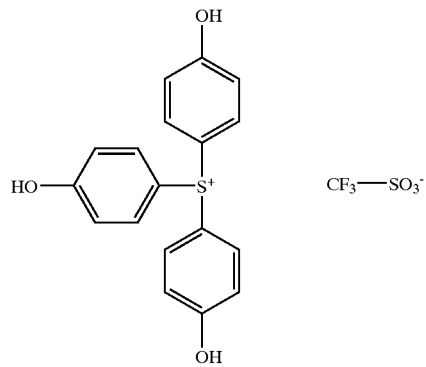
(7-10-11)
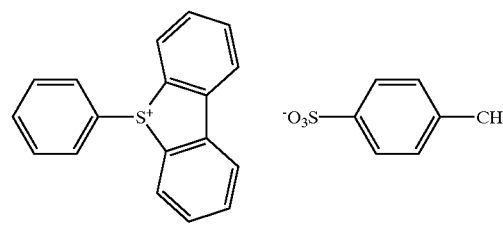
(7-11-8)
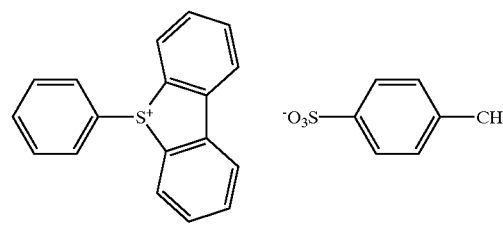
(7-11-13)
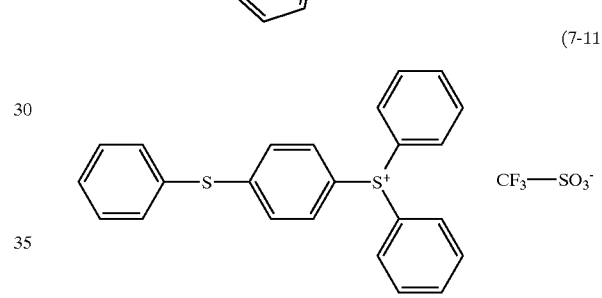
(7-15-11)
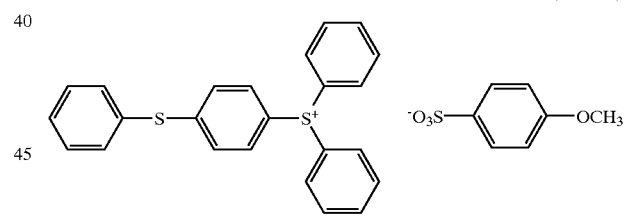
(7-16-8)
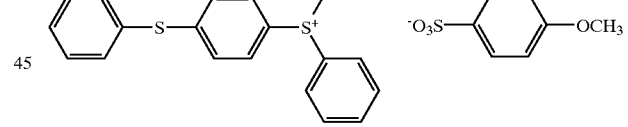
(7-18-8)
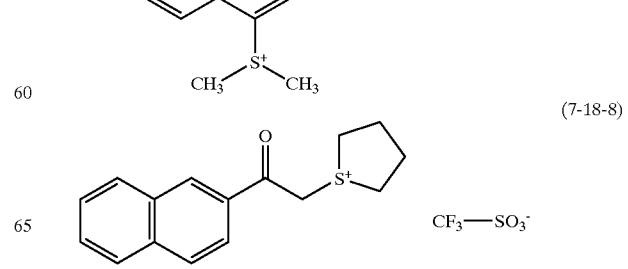

(8-2-20)
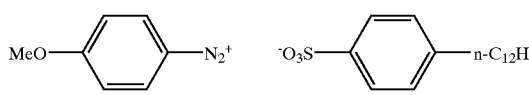

(8-3-20)
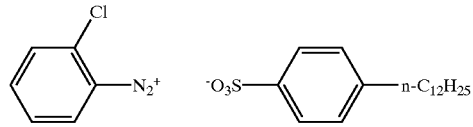

(8-4-21)
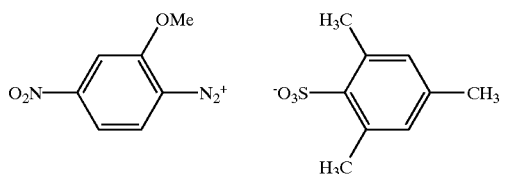

(8-5-21)
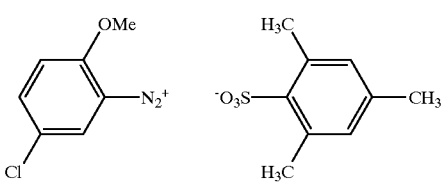

(8-11-20)
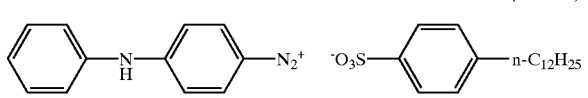

(8-11-21)
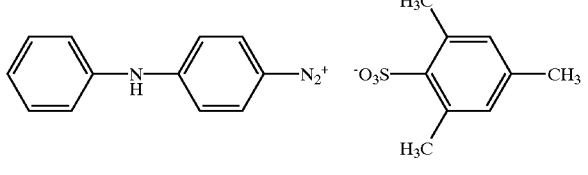

(8-12-21)
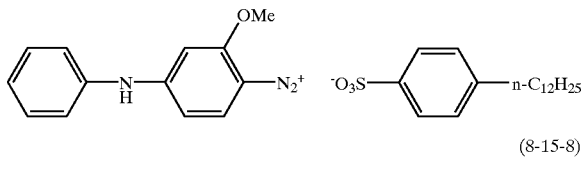

(8-15-8)
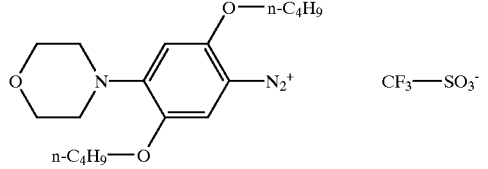

(8-16-21)
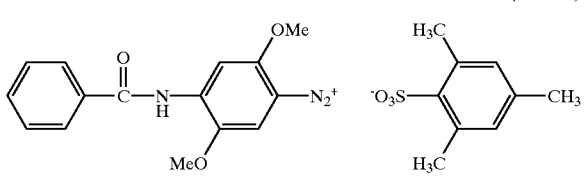

(8-20-20)
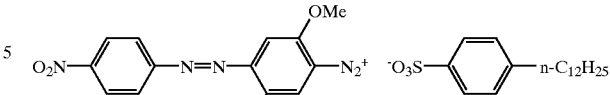

(8-23-21)

Specific examples of the 1,2-naphthoquinonediazidesulfonic acid derivative represented by the general formulae (6) and (7) include, but are not limited to, 1,2-naphthoquinonediazide-5-sulfonate (sulfonic acid ester) of a novolak resin, 1,2-naphthoquinonediazide-4-sulfonate of a novolak resin, 1,2-naphthoquinonediazide-5-sulfonate of a polycondensed resin of pyrogallol with acetone, 1,2-naphthoquinonediazide-4-sulfonate of a polycondensed resin of pyrogallol with acetone, 1,2-naphthoquinonediazide-5-sulfonate of a polycondensed resin made from acetone and a mixture of pyrogallol and resorcin, 1,2-naphthoquinonediazide-4-sulfonate of a polycondensed resin made from acetone and a mixture of pyrogallol and resorcin, 1,2-naphthoquinonediazide-5-sulfonate of a polycondensed resin of a polyvalent phenol with benzaldehyde and acetaldehyde, 1,2-naphthoquinonediazide-4-sulfonate of a polycondensed resin of a polyvalent phenol with benzaldehyde and acetaldehyde, 1,2-naphthoquinonediazide-5-sulfonate of 2,3,4-trihydroxybenzophenone, 1,2-naphthoquinonediazide-4-sulfonate of 2,3,4-trihydroxybenzophenone, 1,2-naphthoquinonediazide-5-sulfonate of 2,4,4'-trihydroxybenzophenone, 1,2-naphthoquinonediazide-4-sulfonate of 2,4,4'-trihydroxybenzophenone, 1,2-naphthoquinonediazide-5-sulfonate of bis(2,4-dihydroxyphenyl)methane, 1,2-naphthoquinonediazide-4-sulfonate of bis(2,4-dihydroxyphenyl)methane, and the like.

In the present invention, the light and heat decomposing compound is added to an image forming material in an amount of 0.01 to 50% by weight, preferably 0.1 to 25% by weight, more preferably 0.5 to 20% by weight based on the total weight of the solid components in the image forming material. When the amount added of the compound is 0.01% by weight or less, an image can not be formed. When the amount added is 50% by weight or more, the non-image portion may be stained in printing.

<Infrared Ray Absorbing Agent>

In the present invention, it is desirable that an infrared ray absorbing agent is contained in an image forming material. The infrared ray absorbing agent in the present invention is a substance which generates heat by absorbing infrared laser light. By adding such an infrared ray absorbing agent it is possible to cause the laser-irradiated portion to generate heat, thus promoting decomposition of the light- and heat-decomposable substance and improving the sensitivity of the image forming material. As such substances, various pigments or dyes can be used.

Pigments usable in the present invention may include commercially available pigments and those disclosed in the Color Index (C. I.) Manual, "Saishin Ganryo Binran (Advanced Pigment Manual)" edited by Nippon Ganryo Gijutsu Kyokai (Japan Pigment Technology Association), published in 1977; "Saishin Ganryo Oyo Gijutsu (Advanced Pigment Application Technology)" by CMC Press, published in 1986; and "Insatsu Ink Gijutsu (Printing Ink Technology)" by CMC Press, published in 1984.

Examples of pigments include black pigments, yellow pigments, orange pigments, brown pigments, red pigments, purple pigments, blue pigments, green pigments, fluorescent pigments, and polymer bond pigments. Specifically, insoluble azo pigments, azo lake pigments, condensed azo pigments, chelate azo pigment, phthalocyanine pigments, anthraquinone pigments, perylene and perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, and carbon black can be used.

These pigments may be used without being subjected to surface treatment, or may be used after being subjected to surface treatment. Examples of surface treatment methods may include a method of surface coating with a resin or a wax, a method of adhering a surfactant onto the surface, and a method of bonding a reactive substance (such as a silane coupling agent, epoxy compound, or polyisocyanate) with the pigment surface. The above-mentioned surface treatment methods are disclosed in "Kinzokusekken no Seishitsu to Oyo (Properties and Applications of Metallic Soaps)" by Saiwai Press; "Insatsu Ink Gijutsu (Printing Ink Technology)" by CMC Press; published in 1984; and "Saishin Ganryo Oyo Gijutsu (Advanced Pigment Application Technology)" by CMC Press, published in 1986.

In the present embodiment, a pigment particle size of 0.01 $\mu$m to 10 $\mu$m is preferable, and that of 0.05 $\mu$m to 1 $\mu$m is more preferable. As methods of dispersing a pigment, known dispersing methods employed in ink production or toner production can be used. Examples of dispersing machines may include ultrasonic dispersing machines, sand mills, attritors, pearl mills, super mills, ball mills, impellers, dispersers, KD mills, colloid mills, dynatrons, triple roll mills, and pressure kneaders. Details thereof are described in "Saishin Ganryo Oyo Gijutsu (Advanced Pigment Application Technology)" by CMC Press, published in 1986.

As dyes, known dyes commercially available or those disclosed in the literature (such as "Senryo Binran (Dye Handbook)" edited by Yuki Gosei Kagaku Kyokai (organic Synthetic Chemistry Association), published in 1970, can be used. Specifically, examples may include azo dyes, metal complex azo dyes, pyrazolone azo dyes, anthraquinone dyes, phthalocyanine dyes, carbonium dyes, quinoneimine dyes, methine dyes, cyanine dyes, aminium dyes, diimonium dyes, squalilium pigments and the like.

Among these pigments and dyes, those that absorb infrared rays or near-infrared rays are particularly preferable, for example, carbon black as the pigment. Examples of preferable dyes include cyanine dyes disclosed in JP-A Nos. 58-125,246, 59-84,356, 59-202,829, and 60-78,787; methine dyes disclosed in JP-A Nos. 58-173,696, 58-181,690, and 58-194,595; naphthoquinone dyes disclosed in JP-A Nos. 58-112,793, 58-224,793, 59-48,187, 59-73,996, 60-52,490, and 60-63,744; squalilium dyes disclosed in JP-A No. 58-112,792 and the like; and cyanine dyes disclosed in U.K. Patent No. 434,875, diimonium dyes described in U.S. Pat. No. 3,557,012 and JP-A4-349,462, aminium dyes described in U.S. Pat. No. 3,631,147, and the like.

Further, near-infrared absorbing agents described in U.S. Pat. No. 5,156,938 are also suitably used.

Moreover, substituted aryl benzo(thio)pyrylium salts disclosed in U.S. Pat. No. 3,881,924; trimethine thiapyrylium salts disclosed in JP-A No. 57-142,645 (U.S. Pat. No. 4,327,169); pyrylium-containing compounds disclosed in JP-A Nos. 58-181,051, 58-220,143, 59-41,363, 59-84,248, 59-84,249, 59-146,063, and 59-146,061; cyanine dyes disclosed in JP-A No. 59-216,146; pentamethine thiopyrylium salts disclosed in U.S. Pat. No. 4,283,475; and pyrylium compounds disclosed in JP-B Nos. 5-13,514 and 5-19,702 can be preferably used as well.

As other examples of particularly preferable dyes, near infrared absorbing dyes disclosed in U.S. Pat. No. 4,756,993 represented by formulas (I) and (II) can be presented.

In the present invention, these dyes or pigments can be added in the image forming material in an amount of 0.01 to 50% by weight, preferably in an amount of 0.1 to 20% by weight, more preferably in an amount of 0.5 to 15% by weight, based on the total weight of the solid components in the image forming material. When the amount is less than 0.01% by weight, an image can not be obtained. On the other hand, when the amount is over 50% by weight, non-image portions may suffer from being stained during printing.

In the present invention, these dyes or pigments may be added to the same layer together with other components, or may be added to another layer that is different from the layer for the other components.

It is preferred that a dye effecting a large absorption in the visible light range is used as the image coloring agent since then the distinction becomes clear between the image-portion and the non-image-portion after image formation.

Specifically, examples may include Oil Yellow #101, Oil Yellow #103, Oil Pink #312, Oil Green BG, Oil Blue BOS, Oil Blue #603, Oil Black BY, Oil Black BS, Oil Black T-505 (manufactured by Orient Chemical Industry, Co., Ltd.), Victoria Pure Blue, Crystal Violet (C.I.42555), Methyl Violet (C.I.42535), Ethyl Violet, RhodamineB (C.I.145170B), Malachite Green (C.I.42000) Methylene Blue (C.I.52015), and dyes disclosed in JP-A No.62-293,247.

The amount of such dyes to be added is 0.01 to 10% by weight of the total weight of the solid components in the image recording material.

In the present invention, various compounds may further be added according to demand.

For example, cross-linking agents such as phenol compounds having an alkoxymethyl group or acyloxymethyl group as described in D. H. SOLOMON, "THE CHEMISTRY OF ORGANIC FILM FORMERS", JP-B No. 1-49,932, JP-A Nos. 7-53,426 and 7-61,946, and the like can be added to the image forming material of the present invention, such that a higher durability of the printing plate can be obtained by conducting the burning treatment after irradiation and development.

Such optional cross-linking agents may be used alone or in combinations of two or more, and the amount to be added of the agents is from 0.2 to 60% by weight, preferably 0.5 to 20% by weight of the photosensitive composition.

In order to enable stable treatment regardless of the fluctuation in development conditions, a nonionic surfactant such as those disclosed in JP-A Nos. 62-251,740 and 3-208, 514 and an amphoteric surfactant such as those disclosed in JP-A Nos. 59-121,044 and 4-13,149 can be added to the image forming material of the present invention.

Examples of nonionic surfactants include sorbitan tristearate, sorbitan monopalmitate, sorbitan triolate, mono glyceride stearate, and polyoxyethylene nonylphenyl ether.

Examples of amphoteric surfactants include alkyl di(aminoethyl)glycine, alkyl polyaminoethylglycine hydrochloride, 2-alkyl-N-carboxyethyl-N-hydroxyethyl imidazolinium betaine, and N-tetradecyl-N,N-type betaine (for example, Amorgen K manufactured by Dai-Ichi Kogyo Co., Ltd.).

The amount to be added of the above-described nonionic surfactants and amphoteric surfactants is preferably from 0.05 to 15% by weight, and more preferably from 0.1 to 5% by weight of the image recording material.

In order to impart flexibility or the like to the film, a plasticizer may be added as needed to the image recording (forming) material of the present invention. Examples of the plasticizer include butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, an oligomer and a polymer of acrylic acid or methacrylic acid.

Further, a cyclic acid anhydride, another filler or the like may be added as a compound for controlling the solubility of the image forming material of the present invention in the alkali aqueous soution.

As the cyclic acid anhydride, examples include phthalic anhyderide, tetrahydrophthalic anhydride, hexahydrophthalic anhydride, 3,6-endooxy-tetrahydrophthalic anhydride, tetrachlorophthalic anhydride, maleic anhydride, chloromaleic anhydride, a-phenylmaleic anhydride, succinic anhydride, pyromellitic acid and the like as described in U.S. Pat. No. 4,115,128. The amount to be added of these cyclic acid anhydride is from 1 to 15% by weight, preferably 2 to 15% by weight, and more preferably 3 to 10% by weight, of the total weight of the solid components in the image forming-material.

Further, there may be added alkyl ethers (for example, ethylcellulose, methylcellulose) and/or surfactants (for example, fluorine-based surfactants) for improving coating property, and plasticizers (for example, tricresyl phosphate, dimethylphthalate, dibutylphthalate, trioctyl phosphate, tributyl phosphate, tributyl citrate, polyethylene glycol, polypropylene glycol and the like) for imparting flexibility and abrasion resistance to a film. The amount to be added of these additives is usually from 0.5 to 30% by weight, of the total weight of the solid components in the image forming material though it may differ depending on the intended use.

In addition, the above-described onium salts, haloalkyl-substituted s-triazine, and epoxy compounds, vinyl ethers, and further, phenol compounds having a hydroxymethyl group and phenol compounds having alkoxymethyl group described in JP-A No. 7-18,120, or the like may also be added.

The image forming material of the present invention is usually prepared in a state in which the above-described components are dissolved or dispersed in a solvent, and by coating this image forming material on a suitable substrate, a photosensitive planographic printing plate can be produced. When used as a resist material of a semiconductor material or the like, the image forming material may be used as a solution in which the above-described components are dissolved in a solvent. Solvents used herein may include, but are not limited to, ethylene dichloride, cyclohexanone, methyl ethyl ketone, methanol, ethanol, propanol, ethylene glycol monomethyl ether, 1-methoxy-2-propanol, 2-methoxy ethyl acetate, 1-methoxy-2-propyl acetate, dimethoxyethane, methyl lactate, ethyl lactate, N,N-dimethyl acetoammide, N,N-dimethyl formamide, tetramethyl urea, N-methyl pyrrolidone, dimethyl sulfoxide, sulfolane, γ-butyrolactone, toluene and water. These solvents are used alone or in combinations thereof.

The concentration of the above-described components (total solid components including additives) is preferably from 1 to 50% by weight, more preferably from 3 to 30% by weight, and further preferably from 5 to 20% by weight, of the weight of the solvent. When coating is carried out, the amount to be coated differs depending on the intended use. For example, in the case of preparing a photosensitive planographic printing plate, the amount of the material to be applied for coating is usually from 0.5 to 3.0 $g/m^2$, preferably from 0.8 to 2.5 $g/m^2$, and more preferably from 1.0 to 2.0 $g/m^2$, in terms of the weight of solid components. In the case of preparing a photoresist, and the amount to be applied is usually from 0.1 to 3.0 $g/m^2$, preferably from 0.2 to 2.0 $g/m^2$, and more preferably from 0.3 to 1.5 $g/m^2$, in terms of the weight of the solid components. Generally, the less the amount of the material applied for coating, the more photosensitivity, but the poorer the obtained film properties.

A supporting substrate to be used in the photosensitive photosensitive planographic printing plate in the present invention is a dimensionally stable plate-like substance, and examples thereof include paper, paper laminated with a plastic (such as polyethylene, polypropylene, and polystyrene), metal plates (such as aluminum, zinc, and copper), plastic films (such as cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and paper or plastic film laminated or deposited with the above-described metals.

A polyester film or an aluminum plate is preferable as a substrate in the present invention. In particular, an aluminum plate is particularly preferable since it has good dimensional stability and can be provided at a relatively low cost. Examples of preferable aluminum plates include pure aluminum plates and alloy plates comprising aluminum as the main component and trace quantities of different elements. Furthermore, plastic films at which aluminum is laminated or deposited can also be used. Examples of different elements which may be included in the aluminum alloy include silicon, iron, manganese, copper, magnesium, chrome, zinc, bismuth, nickel, and titanium. The amount of the different elements in the alloy is preferably 10% by weight or less. As mentioned above, in the present invention, pure aluminum is particularly preferable as a substrate material. However, since production of a completely pure aluminum is difficult in terms of refining technology, that containing trace quantities of different elements can be used. In short, the composition of the aluminum plate to be applied in the present invention need not be specifically defined, and a known aluminum plate may be used. The thickness of the aluminum plate to be used in the present invention is from about 0.1 mm to 0.6 mm, preferably from 0.15 mm to 0.4 mm, and more preferably from 0.2 mm to 0.3 mm.

When an aluminum plate is used as a substrate, it is desirable to conduct roughening treatment prior to the coating process. Also, prior to this roughening of the aluminum plate, a degreasing treatment with a surfactant, an organic solvent, or an aqueous alkaline solution may be conducted to remove the rolling oil from the surface as needed.

The surface roughening treatment of an aluminum plate can be implemented using various methods, such as a mechanically roughening method, an electrochemically roughening method in which a plate surface is electrochemically dissolved, and a chemically roughening method in which a plate surface is selectively dissolved using chemicals. As the mechanical method, known methods such as a ball abrasion method, brush abrasion method, blast abrasion method, and buff abrasion method can be used. As the electrochemically roughening method, a method in which an alternating current or direct current is applied to a plate in an electrolytic solution containing a hydrochloric acid or nitric acid can be used. Further, a method combining both (electrochemical and mechanical) methods as disclosed in JP-A No. 54-63,902 can be used.

The aluminum plate to which a surface roughening treatment as described above has been applied may be further subjected, if necessary, to an alkaline etching treatment or a neutralizing treatment, followed by an optional anodizing treatment so as to improve the water retention property and the abrasion resistance property of the surface. As the electrolyte used in the anodizing treatment of the aluminum plate, various electrolytes that can form a porous oxide film may be used. In general, sulfuric acid, phosphoric acid, oxalic acid, chromic acid, or a mixture thereof can be used as the electrolyte. The concentration of the electrolyte is suitably adjusted according to the type of electrolyte.

The treatment conditions of the anodization may not be specified since they significantly change depending on the type of the electrolyte solution used. In general, appropriate treatment conditions include a concentration of the electrolyte solution from 1 to 80% by weight, a temperature of the electrolyte solution from 5 to 70° C., a current concentration from 5 to 60 ampere/$dm^2$, a voltage from 1 to 100 V, and an electrolysis time from 10 seconds to 5 minutes.

If the amount of a film produced by anodization is less than 1.0 g/$m^2$, durability of the plate may be insufficient, and scratches may be easily produced in a non-image portion of the planographic printing plate, thereby easily causing so-called "scratch toning" in which ink adheres to such scratches in printing.

After the anodizing treatment, a hydrophilicity-increasing treatment may be applied to the aluminum surface, if necessary. Examples of the hydrophilicity-increasing treatment to be used in the present invention include an alkaline metal silicate (such as an aqueous solution of sodium silicate) method as disclosed in U.S. Pat. Nos. 2,714,066, 3,181,461, 3,280,734 and 3,902,734. In this method, the support (aluminium plate) is treated by immersing or electrolyzing the support, in an aqueous solution of sodium silicate. Other examples include a method of treating the alminium plate with potassium fluorozirconate disclosed in JP-B No. 36-22063 and a method of treating it with polyvinyl phosphonate disclosed in U.S. Pat. Nos. 3,276,868, 4,153,461 and 4,689,272.

The image forming material of the present invention can be coated on the above-described substrate by a known coating technology. Examples of such coating technology include a rotation coating method, wire bar coating method, dip coating method, air knife coating method, roll coating method, blade coating method, curtain coating method, spray coating method and the like.

A layer of the image forming material coated as described above is dried at 40 to 150° C. for 30 seconds to 10 minutes using a hot air drier, an infrared ray drier or the like.

When the image forming material of the present invention is used as a photoresist, a substrate as a support can be made from various materials such as a copper plate, copper gatvanized plate, silicon plate, stainless plate, glass plate or the like.

A photosensitive planographic printing plate or photoresist containing the image forming material of the present invention is then subjected to image exposure, and if necessary, a heating treatment and a developing process.

It is possible to provide optionally a primer layer on the supporting substrate before applying the image forming material, to the photosensitive planographic printing plate of the present invention.

As a component of the primer layer, various organic compounds may be used. Such compounds may be selected from carboxy methylcellulose; dextrin; gum arabic; organic phosphonic acids which may be substituted, such as phosphonic acids having an amino group (for example, 2-amino ethyl phosphonic acid), phenyl phosphonic acid, naphthyl phosphonic acid, alkyl phosphonic acid, glycero phosphonic acid, methylene diphosphonic acid, and ethylene diphosphonic acid; organic phosphoric acid which may be substituted, such as phenyl phosphoric acid, naphthyl phosphoric acid, alkyl phosphoric acid, and glycero phosphoric acid; organic phosphinic acids which may be substituted, such as phenyl phosphinic acid, naphthyl phosphinic acid, alkyl phosphinic acid, and glycero phosphinic acid; amino acids such as glycine and β-alanine; and hydrochlorides of amine having a hydroxy group, such as hydrochloride of triethanol amine, and, carboxylic acids such as vinylbenzoic acid, polyvinylbenzoic acid and the like, as well as other compounds. They may be used in admixtures of two or more.

The appropriate amount to be coated of the organic primer layer is suitably from 2 to 200 mg/$m^2$.

A back coat is optionally provided on a rear surface of a substrate. As this back coat, there is preferably used a coating layer composed of a metal oxide obtained by hydrolysis and polycondensation of an organic polymer compound described in JP-A No. 5-45,885 and an organic or inorganic metal compound described in JP-A No. 6-35,174.

Among these coating layers, alkoxy compounds of silicon such as $Si(OCH_3)_4$, $Si(OC_2H_5)_4$, $Si(OC_3H_7)_4$, $Si(OC_4H_9)_4$ and the like are particularly preferable since they are cheap and easily available, and also the resulting coating layer of a metal oxide shows excellent durability in developing.

Further, a mat or mat layer may be provided on a photosensitive film.

Now, the production of a planographic printing plate using the image forming material of the present invention has been described. This planographic printing plate is then usually subjected to image exposure and a developing treatment.

As light sources with active rays used in the image exposure, for example, there can be used a mercury lamp, metal halide lamp, xenon lamp, chemical lamp, carbon ark lamp and the like. As radiation that maybe used, there are an electron beam, X ray, ion beam, far-infrared ray and the like. Further, a g beam, i beam, Deep-UV light, or high concentration energy beam (laser beam) may also be used. As laser beams that may be used, a helium neon laser, argon laser, krypton laser, helium-cadmium laser, KrF eximer laser and the like may be listed as examples. In the present invention, light sources that emit light of wavelengths in a near-infrared to infrared range are preferred, and a solid-state laser or a semiconductor laser are particularly preferable.

After conducting the heat treatment if necessary, the image forming material of the present invention is developed with the aqueous alkaline solution.

A conventionally known aqueous alkaline solution can be used as a developer or a replenisher for the image recording material of the present invention. Examples include inorganic alkaline salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide. Furthermore, also used are organic alkaline agents such a monomethyl amine, dimethyl amine, trimethyl amine, monoethyl amine, diethyl amine, triethyl amine, monoisopropyl amine, diisopropyl amine, triisopropyl amine, n-butyl amine, monoethanol amine, diethanol amine, triethanol amine, monoisopropanol amine, diisopropanol amine, ethylene imine, ethylene diamine and pyridine. These alkaline agents can be used alone or in combinations of two or more.

Particularly preferable developers among these alkaline agents are aqueous solutions of silicate, such as sodium silicate, and potassium silicate. These are preferable because the developing performance can be adjusted by changing the ratio and the concentration of silicon dioxide $SiO_2$ which is a component of silicate and an alkaline metal oxide $M_2O$. For example, alkaline metal silicates such as those disclosed in JP-A No. 54-62,004 and JP-B No. 57-7,427 can be used effectively.

Further, it is known that, in a case in which an automatic developing machine is used for developing, by adding to the developer an aqueous solution (replenisher) whose basicity is stronger than that of the developer, a large amount of planographic printing plates can be developed in succession, without changing the developer in the developing tank for a long period of time. This replenishing method can also be preferably applied to the present invention.

Various types of surfactants and organic solvents may be added to the developer or the replenisher, as desired, for promoting or curbing the developing performance, improving the dispersion of developing scum and the affinity of the printing plate image portion with ink. Examples of preferable surfactants include anionic surfactants, cationic surfactants, nonionic surfactants, and amphoteric surfactants. As the preferable organic solvent, benzyl alcohol and the like are listed. Further, polyethylene glycol or derivatives thereof, polypropylene glycol or derivatives thereof, and the like are preferably added.

Furthermore, reducing agents such as a hydroquinone, resorcin, sodium salt or a potassium salt of an inorganic acid (such as $Na_2SO_3$, $NaHSO_3$), organic carboxylic acid, antifoaming agents, and water softeners can be added to the developer or the replenisher as needed.

Printing plates developed with the above-mentioned developers and replenishers are subjected to a post-treatment with a rinsing solution containing rinsing water, a surfactant, etc., and a desensitizing solution containing gum arabic, starch derivatives, etc. As the post-treatment employed in a case in which the image recording material of the present invention is used as a printing plate, these treatments can be used in combination.

Recently, an automatic developing machine has been widely used for developing printing plates in the printing industries in order to streamline and standardize the printing plate manufacturing operation. In general, an automatic developing machine comprises a developing portion and a post-treatment portion. The developing portion comprises a device for conveying the printing plate, treatment tanks, and spraying devices, wherein the developing process is carried out by horizontally conveying the exposed printing plate and spraying etc., treatment, which is pumped up by a pump, from a spray nozzle to the printing plate as it is being conveyed. In addition, another processing method for developing a printing plate has also become known recently in which an exposed printing plate is immersed in a treatment tank filled with a treatment and is conveyed within the tank by guide rollers. In such automatic processing, a replenisher may replenish each treatment depending upon the amount of printing plates to be developed, the period during which the machine carries out the process and the like.

A so-called disposable treating method may also be applied in which a treatment is effected with a substantially virgin (unused) treating solution.

The photosensitive planographic printing plate using the image forming material of the present invention is subjected to imagewise exposure, developing, washing and/or rinsing and/or gum coating, to obtain the planographic printing plate, and when it has unnecessary image portions (for example, film edge traces of an original image film, or the like), the unnecessary image portions are deleted. Such deletion is conducted, for example, by a method in which a deletion solution as described in JP-B No. 2-13,293 is applied on the unnecessary image portions, allowed to stand for a given time, and thereafter washed with water.

When a planographic printing plate is produced using the positive type image forming material of the present invention, it is desirable that a burning treatment is conducted after the exposure and developing treatments, to conduct cross-linking between the cross-linkable compound and the alkali-aqueous-solution-soluble polymer compound of the present invention, further enhancing the durability of the printing plate in printing.

In a case in which the burning treatment is applied to the planographic printing plate, it is preferable to treat the plate with an affinitizing (counter-etching) solution, as disclosed in JP-B Nos. 61-2,518 and 55-28,062, and JP-A Nos. 62-31, 859 and 61-159,655, before burning it.

Methods thereof include a method of applying the affinitizing solution to the planographic printing plate with a sponge or an absorbent cotton impregnated therewith, a method of applying the affinitizing solution to the printing plate by immersing the plate in a tray filled with the solution, and a method of applying the solution to the plate with an automatic coater. By making the coated surface even with a squeegee or squeegee roller after the application, a more preferable result can be obtained. The appropriate amount of the affinitizing solution to be applied is from 0.03 to 0.8 $g/m^2$ (dry weight), in general.

The planographic printing plate to which the affinitizing solution has been applied and which has been optionally dried, is heated at a high temperature with a burning processor (such as a burning processor BP-1300 commercially available from Fuji Photo Film Co., Ltd.) as needed. The heating temperature and the duration of heating depend on the types of components forming the image. However, a range of 180 to 300° C. and a range of 1 to 20 minutes are preferable, respectively.

The planographic printing plate treated with the burning treatment can be subjected to conventional treatments such as washing with water and gum coating as needed. However, in a case in which a affinitizing solution containing a water-soluble polymer compound is used, a desensitizing treatment such as gum coating can be omitted.

The planographic printing plate obtained by such treatments described above is then used in an offset printer for printing large quantities.

EXAMPLES

Synthesis Example
[Synthesis of Cross-linkable Compound I-2]

16 g (60%) of sodium hydride was dispersed in 20 ml of tetrahydrofuran. To this, 100 ml of a solution in which 50 g of p-nitrobenzyl alcohol was dissolved in tetrahydrofuran, was added in drops while cooling with ice. The mixture was stirred for one hour at room temperature, and thereafter 56 g of iodomethane was added in drops while cooling with ice, and the mixture was further stirred for 3 hours at room temperature. To the reaction solution was added water, and a mixture was extracted with ethyl acetate. The extracted solvent was distilled off under reduced pressure, and the resulting product was purified by silica gel chromatography to obtain 40 g of p-methoxymethylnitrobenzene.

20 g of p-methoxymethylnitrobenzene was reduced by an ordinary method in the presence of iron as a reducing agent to obtain 13 g of p-methoxymethylaniline.

To 80 ml of solution in which 7.3 g of adipic acid chloride was dissolved in acetone, was added in drops a solution of 11 g of p-methoxymethylaniline and 5.9 g of triethylamine in acetone, while cooling with ice. The mixture was further stirred for 3 hours, and the reaction solution was poured into water. The deposited I-2 was filtered, washed with water pored thereon, and thereafter dried under reduced pressure (yield: 12 g)

I-2

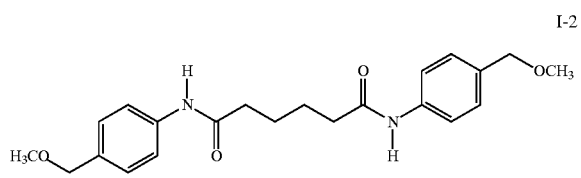

[Synthesis of Cross-linkable Compound I-19]

3.0 g of sodium hydroxide was dissolved in 20 ml of water, and to this was further added 5.3 g of trimesic acid portionwise while cooling with ice. 6.2 g of potassium iodide and 20 g of dimethylacetoamide were added sequentially. Then, 13 g of 4-chloromethylstyrene was slowly added, and the mixture was further stirred for 6 hours at 100° C. After allowing it to be cooled, 50 ml of ethanol and 150 ml of water were added. After the pH was controlled to around 8 with sodium hydrogen carbonate, the solid in the reaction mixture was filtered off. Recrystallizatin was conducted using ethyl acetate and methanol to obtain 6 g of a compound I-19.

I-19

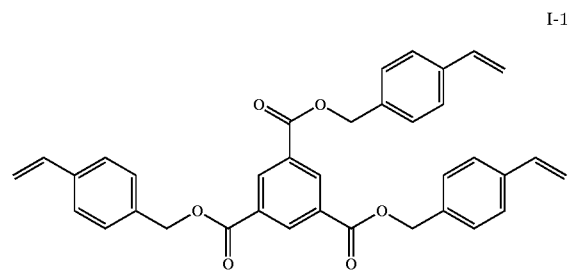

[Synthesis of Cross-linkable Compound I-22]

20 g of 2,6-bis(hydroxymethyl)-p-cresol was dissolved in 150 g of 1-methoxy-2-propanol, and to this was added in drops a mixture of 1.2 g of sulfuric acid and 30 g of 1-methoxy-2-propanol. After the reaction solution was stirred for 6 hours at 700° C., water was added and then extraction was conducted with ethyl acetate. The extracted phase was washed with a saturated aqueous sodium hydrogen carbonate solution, dried, and thereafter ethyl acetate was distilled off. The resulted liquid was purified with silica gel column chromatography to obtain 18 g of a compound I-22.

I-22

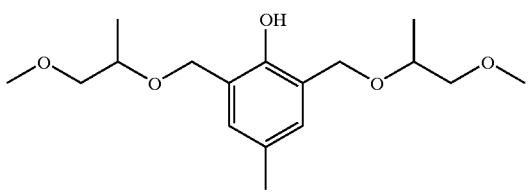

[Production of Substrate 1]

The surface of an aluminum plate having a thickness of 0.30 mm was roughened using a nylon brush and a water suspension of 400 mesh pumice stone, and thereafter washed well with water. The plate was immersed in 10% sodium hydroxide at 70° C. for 60 seconds to conduct etching, washed with a water flow and thereafter neutralized and washed with 20% nitric acid, and washed again with water. The plate was then subjected to electrolytic surface roughening treatment in a 1% aqueous nitric acid solution at a cathode electricity amount of 160 coulomb/dm$^2$ using a sine-curved alternating waveform current under condition of VA=12.7 V. The roughness of the surface was measured to find it was $0.6\mu$ (Ra expression). Subsequently, the plate was immersed in a 30% aqueous sulfuric acid solution, and de-smutted at 55° C. for 2 minutes, and thereafter anodized in a 20% aqueous sulfuric acid solution at a current density of 2 A/dm$^2$ so that the thickness was 2.7 g/m$^2$, to obtain a plate 1.

Example 1

A solution 1 for priming (primary coating) having the composition described below was coated on the surface of the substrate 1 treated as described above. The substrate was dried at 80° C. for 30 seconds. The amount coated, after drying, was 30 mg/m$^2$ (substrate 2).

(Solution 1 for a Primary Coating)

| | |
|---|---|
| Phenyl phosphonic acid | 0.15 g |
| Methanol | 90 g |
| Pure water | 10 g |
| A photosensitive solution (P-1) described below was coated on the substrate 2 obtained as described above. The substrate was dried at 100° C. for 1 minute to obtain a positive type photosensitive planographic printing plate. The weight of the coating after drying, was 1.5 g/m$^2$. (Photosensitive solution(P-1)) | |
| Light and heat decomposing substance (A-1) | 0.15 g |
| Infrared ray absorbing agent NK-2014 (manufactured by Nippon Kanko Shikiso Kenkyusho K.K.) | 0.10 g |
| Phenolic novolak (weight-average molecular weight: 10,000) | 1.6 g |
| Cross-linkable compound (I-1) | 0.40 g |
| MEGAFAC F-177 (fluorine-baseed surfactant manufactured by Dainippon Ink & Chemicals. Inc.) | 0.06 g |
| Methyl ethyl ketone | 15 g |
| 1-Methoxy-2-propanol | 5 g |
| Methanol | 7 g |

The resulted positive planographic printing plate (PL-1) was exposed using a semiconductor laser emitting an infrared ray having a wavelength of 830 nm. After exposure, it was developed using a developer DP-4 (1:8) manufactured by Fuji Photo Film Co., Ltd., and washed with water. The resulted planographic printing plate was then used for printing with a Hydel KOR-D machine. About 43,000 sheets of excellent printed articles without stains on non-image portions were obtained. In another test, the surface of a planographic printing plate obtained in the same manner was first wiped with a burning affinitizing solution BC-3 manufactured by Fuji Photo Film Co., Ltd., treated with a burning apparatus BP-1300 at 260° C. for 7 minutes, and thereafter printing was conducted. About 122,000 sheets of excellent printed articles without stains on non-image portions were obtained.

A structure of the light- and heat-decomposable substance (A-1) used in this example is shown below.

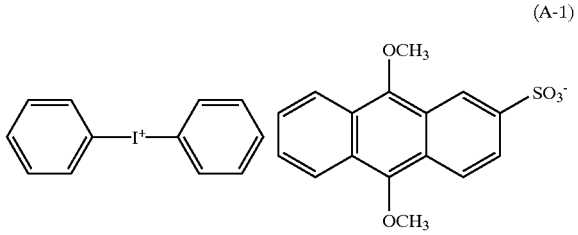

Light and Heat Decomposing Substance (A-1)

Example 2

A photosensitive solution (P-2) was prepared in which the cross-linkable compound (I-2) in the photosensitive solution (P-1) used in Example 1 was substituted by (I-19). This solution was coated on the aluminum plate which had been coated with the primer used in Example 1. The plate was then dried at 100° C. for 1 minute to obtain a positive type planographic printing plate (PL-2). The weight of the coating, after drying, was 1.5 g/m².

The resulted positive type planographic printing plate was exposed using a semiconductor laser emitting an infrared ray having a wavelength of 830 nm. After exposure, it was developed using the developer DP-4 (1:8) manufactured by Fuji Photo Film Co., Ltd., and washed with water. The resulted planographic printing plate was used for printing with a Hydel KOR-D machine. About 41,000 sheets of excellent printed articles without stains on non-image portions were obtained. Further, inspa case in which the burning treatment was conducted before printing, about 110,000 sheets of excellent printed articles without stains on non-image portions were obtained.

Comparative Example 1

A positive type planographic printing plate (PLE-1) was produced in the same manner as in Examples 1 and 2 except that the cross-linkable compound of the present invention was not used in the preparation of the photosensitive solution (the mass reduction caused by the lack of the cross-linkable compound was compensated by an increase in the amount of the binder). Image formation was attempted using the resulted planographic printing plate (PLE-1) in the same manner as in Examples 1 and 2; however, the entire photosensitive layer was dissolved and an image was not obtained.

It is known from Examples 1 and 2, and from Comparative Example 1 that a planographic printing plate using the positive type image recording material of the present invention exhibits excellent image forming property and has excellent durability in printing. Further, it is known that durability in printing is remarkably improved by conducting the burning treatment after image formation.

Example 3

A photosensitive solution (P-3) described below was coated on the substrate 2 used in Example 1, and the plate was dried at 100° C. for 1 minute to obtain a positive type photosensitive planographic printing plate. The weight of the coating, after drying, was 1.5 g/m².

| (Photosensitive solution (P-3)) | |
|---|---|
| Light and heat decomposing substance (A-1) | 0.15 g |
| Infrared ray absorbing agent NK-2014 (manufactured by Nippon Kanko Shikiso Kenkyusho K.K.) | 0.10 g |
| Polyhydroxystyrene (weight-average molecular weight: 10,000) | 1.6 g |
| Cross-linkable compound (I-22) | 0.40 g |
| MEGAFAC F-177 (fluorine-based surfactant manufactured by Dainippon Ink & Chemicals. Inc.,) | 0.06 g |
| Methyl ethyl ketone | 15 g |
| 1-Methoxy-2-propanol | 5 g |
| Methanol | 7 g |

The resulted positive type planographic printing plate (PL-3) was exposed using a semiconductor laser emitting an infrared ray having a wavelength of 830 nm. After exposure, it was developed using the developer DP-4 (1:8) manufactured by Fuji Photo Film Co., Ltd., and washed with water. The resulted planographic printing plate was used for printing with a Hydel KOR-D machine. About 49,000 sheets of excellent printed articles without stains on non-image portions were obtained. Further, in a case in which the surface of a planographic printing plate obtained in the same manner was first wiped with the burning affinitizing solution BC-3 manufactured by Fuji Photo Film Co., Ltd., treated with a burning apparatus BP-1300 at 260° C. for 7 minutes, and thereafter used to conduct printing, about 1,290,000 sheets of excellent printed articles without stains on non-image portions were obtained.

Example 4

A photosensitive solution (P-4) was prepared in the same as in the preparation of the photosensitive solution (P-3) in Example 3 except for replacing the cross-linkable compound of the present invention with diglycidylethylene glycol. This solution was coated on the aluminum plate which had been coated with the primer used in Example 1. The plate was dried at 100° C. for 1 minute to obtain a positive type planographic printing plate (PL-4). The weight of the coating after drying was 1.5 g/m².

The resulted positive type planographic printing plate was exposed using a semiconductor laser emitting an infrared ray having a wavelength of 830 nm. After exposure, it was developed using a developer DP-4 (1:8) manufactured by Fuji Photo Film Co., Ltd., and washed with water. The resulted planographic printing plate was used for printing with a Hydel KOR-D machine. About 48,000 sheets of excellent printed articles without stains on non-image portions were obtained. Further, in a case in which the burning treatment was conducted before printing, about 123,000 sheets of excellent printed articles without stains on non-image portions were obtained.

Comparative Example 2

A positive type planographic printing plate (PLE-2) was produced in the same manner as in Examples 3 and 4 except that the cross-linkable compound of the present invention was not used in the preparation of the photosensitive solution (the mass reduction caused by lacking of the cross-linkable compound was compensated by increase of the binder). Image formation was tried using the resulted planographic printing plate (PLE-2) in the same manner as in Examples 3 and 4; however, all of the photosensitive layer was dissolved and no image was obtained.

It is known from Examples 3 and 4 and Comparative Example 2 that a planographic printing plate using the positive type image recording material of the present invention exhibits excellent image forming property and has excellent durability in printing. Further, it is known that durability in printing is remarkably improved by conducting the burning treatment after image formation.

Example 5

A photosensitive solution (P-5) described below was coated on the substrate 2 used in Example 1. The substrate was dried at 100° C. for 1 minute to obtain a positive type photosensitive planographic printing plate. The weight of the coating, after drying, was 1.5 g/m².

| (Photosensitive solution(P-5)) | |
| --- | --- |
| Light and heat decomposing substance (A-2) | 0.15 g |
| Infrared ray absorbing agent NK-2014 (manufactured by Nippon Kanko Shikiso Kenkyusho K.K.) | 0.10 g |
| Phenolic novolak (weight-average molecular weight: 10,000) | 1.6 g |
| Cross-linkable compound (I-2) | 0.40 g |
| MEGAFAC F-177 (fluorine-based surfactant manufactured by Dainippon Ink & Chemicals. Inc.) | 0.06 g |
| Methyl ethyl ketone | 15 g |
| 1-Methoxy-2-propanol | 5 g |
| Methanol | 7 g |

The resulted positive type planographic printing plate (PL-5) was exposed using a semiconductor laser emitting an infrared ray having a wavelength of 830 nm. After exposure, it was developed using a developer DP-4 (1:8) manufactured by Fuji Photo Film Co., Ltd., and washed with water. The resulted planographic printing plate was used for printing with a Hydel KOR-D machine. About 44,000 sheets of excellent printed articles without stains on non-image portions were obtained. Further, in a case in which the surface of a planographic printing plate obtained in the same manner was first wiped with a burning affinitizing solution BC-3 manufactured by Fuji Photo Film Co., Ltd., treated by a burning apparatus BP-1300 at 260° C. for 7 minutes, and thereafter used to conduct printing, about 126,000 sheets of excellent printed articles without stains on non-image portions were obtained.

A structure of the light- and heat-decomposable substance (A-2) used is shown below.

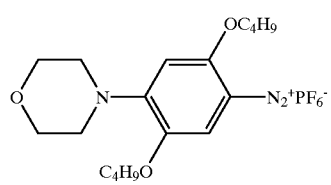

Light and Heat Decomposing Substance (A-2)

Example 6

A photosensitive solution (P-6) was prepared in the same manner as in the preparation of the photosensitive solution (P-5) in Example 5 except for replacing the cross-linkable compound with (I-19). This solution was coated on the aluminum plate which had been coated with the primer used in Example 1. The plate was dried at 100° C. for 1 minute to obtain a positive type planographic printing plate (PL-6). The weight of the coating, after drying, was 1.5 g/m².

The resulted positive type planographic printing plate was exposed using a semiconductor laser emitting an infrared ray having a wavelength of 830 nm. After exposure, it was developed using a developer DP-4 (1:8) manufactured by Fuji Photo Film Co., Ltd., and washed with water. The resulted planographic printing plate was used for printing with a Hydel KOR-D machine. About 46,000 sheets of excellent printed articles without stains on non-image portions were obtained. Further, in a case in which the burning treatment was conducted before printing, about 110,000 sheets of excellent printed articles without stains on non-image portions were obtained.

Comparative Example 3

A positive type planographic printing plate (PLE-3) was produced in the same manner as in Examples 5 and 6 except that the cross-linkable compound of the present invention was not used in the preparation of the photosensitive solution (the mass reduction caused by the lack of the cross-linkable compound was compensated by an increase in the amount of the binder). Image formation was tried using the resulted planographic printing plate (PLE-3) in the same manner as in Examples 5 and 6; however, all of the photosensitive layer was dissolved and no image was obtained.

It is known from Examples 5 and 6 and Comparative Example 3 that a planographic printing plate using the positive type image recording material of the present invention exhibits excellent image forming property and has excellent durability in printing. Further, it is known that durability of the plate in printing is remarkably improved by conducting the burning treatment after image formation.

Example 7

A photosensitive solution (P-7) described below was coated on the substrate 2 used in Example 1. The substrate was dried at 100° C. for 1 minute to obtain a positive type photosensitive planographic printing plate. The weight of the coating after drying was 1.5 g/m².

| (Photosensitive solution (P-7)) | |
| --- | --- |
| Light and heat decomposing substance (A-2) | 0.15 g |
| Infrared ray absorbing agent NK-2014 (manufactured by Nippon Kanko Shikiso Kenkyusho K.K.) | 0.10 g |
| Polyhydroxystyrene (weight-average molecular weight: 10,000) | 1.6 g |
| Cross-linkable compound (I-22) | 0.40 g |
| MEGAFAC F-177 (fluorine-based surfactant manufactured by Dainippon Ink & Chemicals. Inc.) | 0.06 g |
| Methyl ethyl ketone | 15 g |
| 1-Methoxy-2-propanol | 5 g |
| Methanol | 7 g |

The resulted positive type planographic printing plate (PL-7) was exposed using a semiconductor laser emitting an infrared ray having a wavelength of 830 nm. After exposure, it was developed using a developer DP-4 (1:8) manufactured by Fuji Photo Film Co., Ltd., and washed with water. The resulted planographic printing plate was used for printing with a Hydel KOR-D machine. About 40,000 sheets of excellent printed articles without stains on non-image portions were obtained. Further, in a case in which the surface of a planographic plate obtained in the same manner was first wiped with a burning affinitizing solution BC-3 manufactured by Fuji Photo Film Co., Ltd., treated by a burning apparatus BP-1300 at 260° C. for 7 minutes, and thereafter used to conduct printing, about 130,000 sheets of excellent printed articles without stains on non-image portions were obtained.

Example 8

A photosensitive solution (P-8) was prepared in the same manner as in the preparation of the photosensitive solution (P-3) in Example 7 except for replacing the cross-linkable compound of the present invention with diglycidylethylene glycol. This solution was coated on an aluminum plate which had been coated with the primer used in Example 1. The plate was dried at 100° C. for 1 minute to obtain a positive type planographic printing plate (PL-8). The weight of the coating after drying was 1.5 g/m².

The resulted positive planographic printing plate was exposed using a semiconductor laser emitting an infrared ray having a wavelength of 830 nm. After exposure, it was developed using a developer DP-4 (1:8) manufactured by Fuji Photo Film Co., Ltd., and washed with water. The resulted planographic printing plate was used for printing with a Hydel KOR-D machine. About 40,000 sheets of excellent printed articles without stains on non-image portions were obtained. Further, in a case in which the burning treatment was conducted before printing, about 130,000 sheets of excellent printed articles without stains on non-image portions were obtained.

Comparative Example 4

A positive type planographic printing plate (PLE-4) was produced in the same manner as in Examples 7 and 8 except that the cross-linkable compound of the present invention was not used in the preparation of the photosensitive solution(the mass reduction caused by the lack of the cross-linkable compound was compensated by an increase in the amount of the binder). Image formation was tried using the resulted planographic printing plate (PLE-4) in the same manner as in Examples 7 and 8; however, all of the photosensitive layer was dissolved and no image was obtained.

It is known from Examples 7 and 8 and Comparative Example 4 that a planographic printing plate using the positive type image recording material of the present invention exhibits excellent image forming property and has excellent durability in printing. Further, it is known that durability of the plate in printing is remarkably improved by conducting the burning treatment after image formation.

Example 9

A photosensitive solution (P-9) described below was coated on the substrate 2 used in Example 1. The substrate was dried at 100° C. for 1 minute to obtain a positive type photosensitive planographic printing plate. The weight of the coating after drying was 1.5 g/m².

| (Photosensitive solution (P-9)) | |
|---|---|
| Light and heat decomposing substance (esterified compound of a pyrogallol-acetone resin and 1.2-naphthoquinonediazide-5-sulfonyl chloride) (described in Example 1 of U.S. Pat. No. 3,635,709) | 0.15 g |
| Infrared ray absorbing agent NK-2014 (manufactured by Nippon Kanko Shikiso Kenkyusho K.K.) | 0.10 g |
| Phenylic novolak (weight-average molecular weight: 10,000) | 1.6 g |
| Cross-linkable compound (I-2) | 0.40 g |
| MEGAFAC F-177 (fluorine-based surfactant manufactured by Dainippon Ink & Chemicals. Inc.) | 0.06 g |
| Methyl ethyl ketone | 15 g |
| 1-Methoxy-2-propanol | 5 g |
| Methanol | 7 g |

The resulted positive type planographic printing plate (PL-9) was exposed using a semiconductor laser emitting an infrared ray having a wavelength of 830 nm. After exposure, it was developed using a developer DP-4 (1:8) manufactured by Fuji Photo Film Co., Ltd., and washed with water. The resulted planographic printing plate was used for printing with a Hydel KOR-D machine. About 49,000 sheets of excellent printed articles without stains on non-image portions were obtained. Further, in a case in which the surface of a planographic plate obtained in the same manner was first wiped with a burning affinitizing solution BC-3 manufactured by Fuji Photo Film Co., Ltd., treated by a burning apparatus BP-1300 at 260° C. for 7 minutes, and thereafter used to conduct printing, about 122,000 sheets of excellent printed articles without stains on non-image portions.

Example 10

A photosensitive solution (P-10) was prepared in the same manner as in the preparation of the photosensitive solution (P-9) in example 9 except for replacing the cross-linkable compound of the present invention with (I-19). This solution was coated on an aluminum plate which had been coated with the primer used in Example 1. The plate was dried at 100° C. for 1 minute to obtain a positive type planographic printing plate (PL-10). The weight of the coating, after drying, was 1.5 g/m².

The resulted positive type planographic printing plate was exposed using a semiconductor laser emitting an infrared ray having a wavelength of 830 nm. After exposure, it was developed using a developer DP-4 (1:8) manufactured by Fuji Photo Film Co., Ltd., and washed with water. The resulted planographic printing plate was used for printing with a Hydel KOR-D machine. About 43,000 sheets of excellent printed articles without stains on non-image portions were obtained. Further, in a case in which the burning treatment was conducted before printing, about 121,000 sheets of excellent printed articles without stains on non-image portions were obtained.

Comparative Example 5

A positive type planographic printing plate (PLE-5) was produced in the same manner as in Examples 9 and 10 except that the cross-linkable compound of the present invention was not used in the preparation of the photosensitive solution (the mass reduction caused by the lack of the cross-linkable compound was compensated by an increase in the amount of the binder). Image formation was tried using the resulted planographic printing plate (PLE-5) in the same manner as in Examples 9 and 10; however, all of the photosensitive layer was dissolved and no image was obtained.

It is known from Examples 9 and 10 and Comparative Example 5 that a planographic printing plate using the positive type image recording material of the present invention exhibits excellent image forming property and has excellent durability in printing. Further, it is known that durability in printing is remarkably improved by conducting the burning treatment after image formation.

Example 11

A photosensitive solution (P-11) described below was coated on the substrate 2 used in Example 1. The substrate was dried at 100° C. for 1 minute to obtain a positive type photosensitive planographic printing plate. The weight of the coating, after drying, was 1.5 g/m².

| (Photosensitive solution (P-11)) | |
|---|---|
| Light and heat decomposing substance (esterified compound of a pyrogallol-acetone resin and 1,2-naphthoquinonediazide-5-sulfonyl chloride) (described in Example 1 of U.S. Pat. No. 3,635,709) | 0.15 g |
| Infrared ray absorbing agent NK-2014 (manufactured by Nippon Kanko Shikiso Kenkyusho K.K.) | 0.10 g |
| Polyhydroxystyrene (weight-average molecular weight: 10,000) | 1.6 g |
| Cross-linkable compound (I-22) | 0.40 g |
| MEGAFAC F-177 (fluorine-based surfactant manufactured by Dainippon Ink & Chemicals. Inc.) | 0.06 g |
| Methyl ethyl ketone | 15 g |
| 1-Methoxy-2-propanol | 5 g |
| Methanol | 7 g |

The resulted positive type planographic printing plate (PL-11) was exposed using a semiconductor laser emitting an infrared ray having a wavelength of 830 nm. After exposure, it was developed using a developer DP-4 (1:8) manufactured by Fuji Photo Film Co., Ltd., and washed with water. The resulted planographic printing plate was used for printing with a Hydel KOR-D machine. About 40,000 sheets of excellent printed articles without stains on non-image portions were obtained. Further, in a case in which the surface of a planographic printing plate obtained in the same manner was first wiped with a burning affinitizing solution BC-3 manufactured by Fuji Photo Film Co., Ltd., treated by a burning apparatus BP-1300 at 260° C. for 7 minutes, and thereafter used to conduct printing, about 139,000 sheets of excellent printed articles without stains on non-image portions were obtained.

Example 12

A photosensitive solution (P-12) was prepared in the same manner as in the preparation of the photosensitive (P-11) in Example 11 except for replacing the cross-linkable compound of the present invention with diglycidylethylene glycol. This solution was coated on an aluminum plate which had been coated with the primer used in Example 1. The plate was dried at 100° C. for 1 minute to obtain a positive type planographic printing plate (PL-12). The weight of the coating, after drying, was 1.5 g/m².

The resulted positive type planographic printing plate was exposed using a semiconductor laser emitting an infrared ray having a wavelength of 830 nm. After exposure, it was developed using a developer DP-4 (1:8) manufactured by Fuji Photo Film Co., Ltd., and washed with water. The resulted planographic printing plate was used for printing with a Hydel KOR-D machine. About 42,000 sheets of excellent printed articles without stains on non-image portions were obtained. Further, inspa case in which the burning treatment was conducted before printing, about 138,000 sheets of excellent printed articles without stains on non-image portions were obtained.

Comparative Example 7

A positive type planographic printing plate (PLE-7) was produced in the same manner as in Examples 11 and 12 except that the cross-linkable compound of the present invention was not used in the preparation of the photosensitive solution (the mass reduction caused by the lack of the cross-linkable compound was compensated by an increase in the amount of the binder). Image formation was tried using the resulted planographic printing plate (PLE-7) in the same manner as in Examples 11 and 12; however, all of the photosensitive layer was dissolved and no image was obtained.

It is known from Examples 11 and 12 and Comparative Example 7 that a planographic printing plate using the positive type image recording material of the present invention exhibits excellent image forming property and has excellent durability in printing. Further, it is known that durability in printing is remarkably improved by conducting the burning treatment after image formation.

Example 13

[Production of Substrate 3]

The surface of an aluminum plate having a thickness of 0.24 mm was roughened using a nylon brush and a water suspension of 400 mesh pumice stone, and thereafter washed well with water. The plate was immersed in 10% sodium hydroxide at 70° C. for 20 seconds to conduct etching, washed again with flowing water, and thereafter neutralized and washed with 20% nitric acid, and washed with water. The result was subjected to an electrolytic roughening treatment in a 0.7% aqueous nitric acid solution at a cathode electricity amount of 400 coulomb/dm³ using a sine-curved alternating waveform current under a condition of VA=12.7 V. The plate was treated in a 10% aqueous sodium hydroxide solution so that the amount dissolved of aluminum on the surface was 0.9 g/m². After washing, it was neutralized in a 20% nitric acid, washed to remove smut, and thereafter anodized in an 18% aqueous sulfuric acid solution so that the thickness of the oxide coat was 3 g/m².

Next, it was immersed in a 3% aqueous solution of sodium silicate at 30° C. for 20 seconds, washed, dried, and thereafter a solution for priming 2 (primary coating) having the following composition was coated on the surface of the substrate and dried at 80° C. for 30 seconds.

The amount coated, after drying, was 20 mg/M².

| (Solution 2 for a primary coating) | |
|---|---|
| Polyvinylbenzoic acid | 0.20 g |
| Methanol | 95 g |
| Pure water | 5 g |

The photosensitive solution (P-9) described above was coated on the substrate 3 obtained as described above. The substrate was dried at 100° C. for 1 minute to obtain a positive type photosensitive planographic printing plate. The weight of the coating, after drying, was 1.5 g/m².

The resulted positive type planographic printing plate (PL-13) was exposed using a semiconductor laser emitting an infrared ray having a wavelength of 830 nm. After exposure, it was developed using a developer having the following composition.

| (Developer) | |
|---|---|
| D-sorbitol | 4.0% by weight |
| Sodium hydroxide | 0.98% by weight |
| Sodium carbonate | 1.05% by weight |
| Ethylenediaminepolyoxyethylene adduct | 0.03% by weight |
| Water | 94.0% by weight |

The resulted planographic printing plate was used for printing with a Hydel KOR-D machine. About 40,000 sheets of excellent printed articles without stains on non-image portions were obtained. Further, in a case in which the surface of a planographic plate obtained in the same manner was first wiped with a burning affinitizing solution BC-3 manufactured by Fuji Photo Film Co., Ltd., treated by a burning apparatus BP-1300 at 260° C. for 7 minutes, and thereafter used to conduct printing, about one 105,000 sheets of excellent printed articles without stains on non-image portions were obtained.

Example 14

The photosensitive solution (P-11) described above was coated on the substrate 3 obtained as described above. The substrate was dried at 100° C. for 1 minute to obtain a positive type photosensitive planographic printing plate. The weight of the coating after drying was 1.5 g/m².

The resulted positive type planographic printing plate (PL-14) was exposed using a semiconductor laser emitting an infrared ray having a wavelength of 830 nm. After exposure, it was developed using a developer having the same composition as that used in Example 10, and washed. The resulted planographic printing plate was used for printing with a Hydel KOR-D machine. About 43,000 sheets of excellent printed articles without stains on non-image portions were obtained. Further, in s case in which the surface of a planographic plate obtained in the same manner was first wiped with a burning affinitizing solution BC-3 manufacturedby Fuji Photo Film Co., Ltd., treated by a burning apparatus BP-1300 at 260° C. for 7 minutes, and thereafter used to conduct printing, about 101,000 sheets of excellent printed articles without stains on non-image portions were obtained.

What is claimed is:

1. A positive image forming material comprising
A: an alkali-aqueous-solution-soluble polymer compound having a phenolic hydroxyl group,
B: a light and heat decomposing compound which suppresses alkali-aqueous-solution-solubility of said alkali-aqueous-solution-soluble polymer (A) having a phenolic hydroxyl group and is decomposed by light or heat to lose its alkali-aqueous-solution-solubility-suppressing effect on said compound (A),
C: a cross-linkable compound which increases said solubility-suppressing effect of said compound (B) when used together with said component (B) in a composition containing the alkali-aqueous-solution-soluble polymer compound (A) having a phenolic hydroxyl group, and which has in its molecule two or more cross-linkable groups which are cross-linked with the alkali-aqueous-solution-soluble polymer compound (A) with heating, wherein said cross-linkable compound (C) contains in its molecule a hetero atom that can effect interaction including hydrogen bond formation, and ionic interaction with both the alkali-aqueous-solution-soluble polymer compound (A) and said light and heat decomposing compound (B), thereby increasing said solubility-suppressing effect of said light and heat decomposing compound (B), and wherein said cross-linkable compound (C) conducts a cross-linking reaction with said alkali-aqueous-solution-soluble polymer compound (A) having a phenolic hydroxyl group when heated after alkali development, and due to this cross-linking, film strength of said compound (A) in a non-irradiated portion increases, and
D: an infrared ray absorbing agent.

2. A positive image forming material according to claim 1, wherein said cross-linkable compound (C) has a substituent containing said hetero atom and exhibiting said interaction.

3. A positive image forming material according to claim 2, wherein said substituent is an ether bond, amide bond, sulfonamide bond, ester bond or hydroxyl group.

4. A positive image forming material according to claim 1, wherein said cross-linkable group is a condensation-cross-linkable substituent or a polymerizable substituent.

5. A positive image forming material according to claim 4, wherein said condensation-cross-linkable substituent is a substituted or unsubstituted hydroxymethyl group, a substituted or unsubstituted alkoxymethyl group or a substituted or unsubstituted aryloxymethyl group.

6. A positive image forming material according to claim 4, wherein said polymerizable substituent is a cation-polymerizable substituent, for example, an ethylenic double bond, epoxy group, vinyl ether group or radical-polymerizable substituent.

7. A positive image forming material according to claim 1, wherein said cross-linkable compound (C) is a compound represented by one of the following structural formulae I-1 to 1-24:

I-1

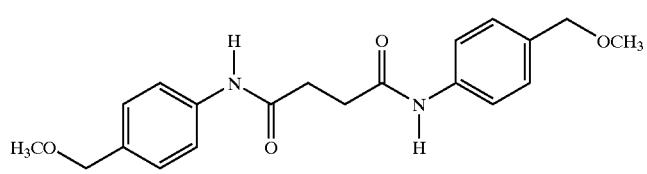

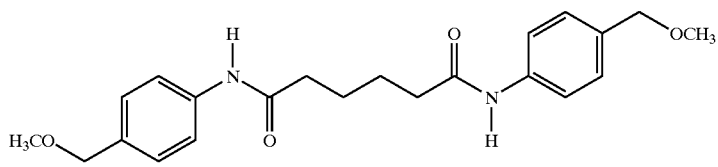
I-2
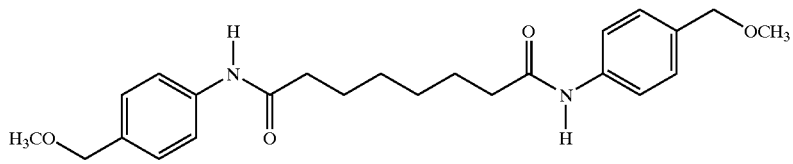
I-3
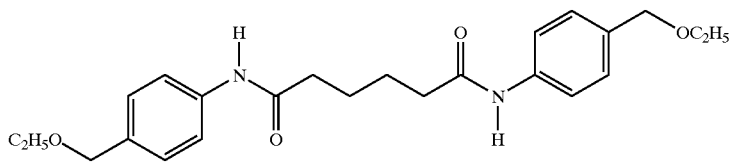
I-4
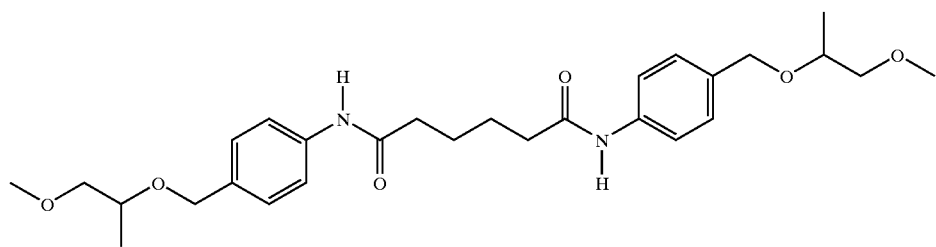
I-5
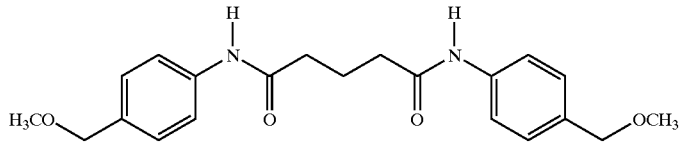
I-6
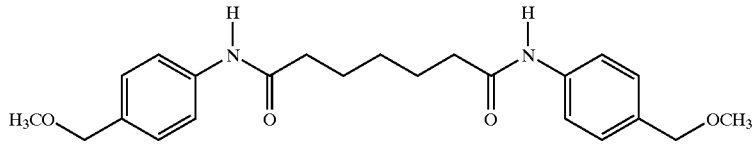
I-7
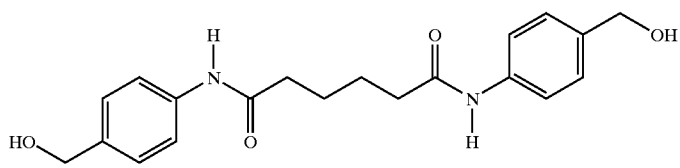
I-8
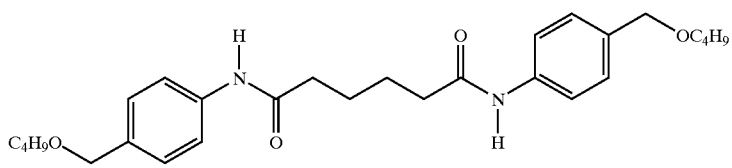
I-9

I-10
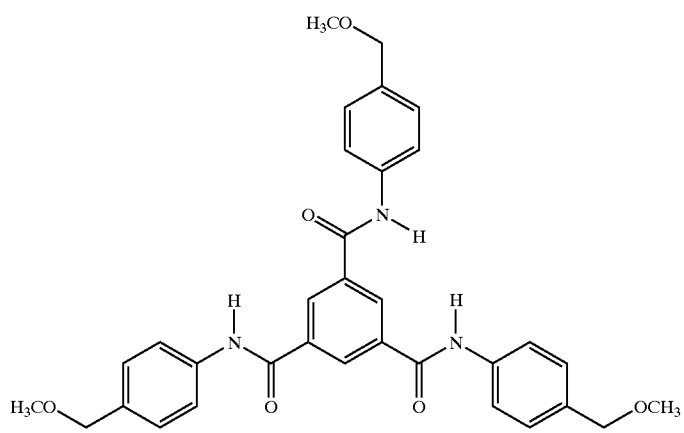
I-11
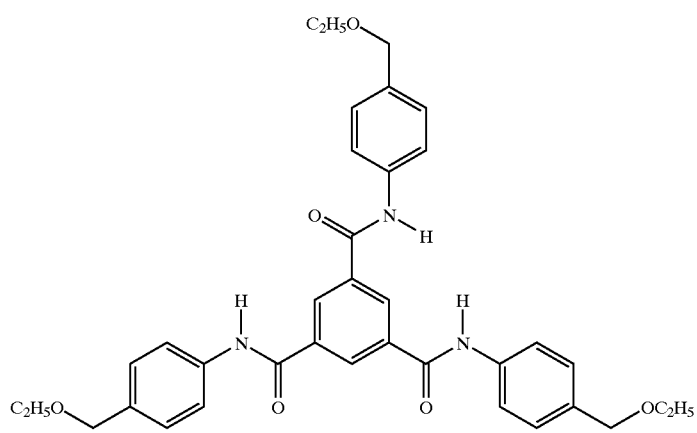
I-12
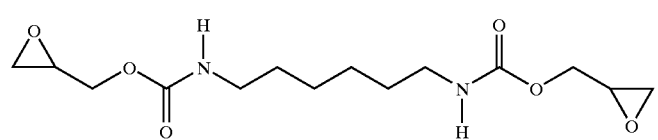
I-13
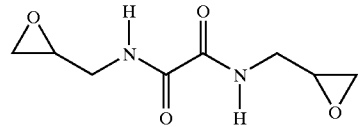
I-14
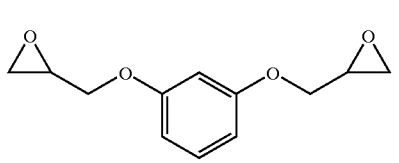
I-15
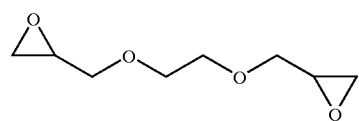
I-16
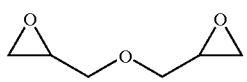
I-17
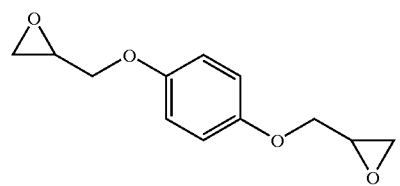
I-18
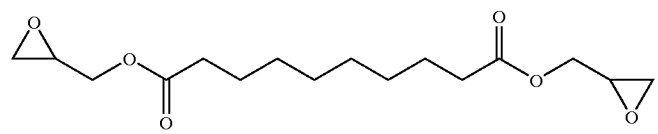

-continued

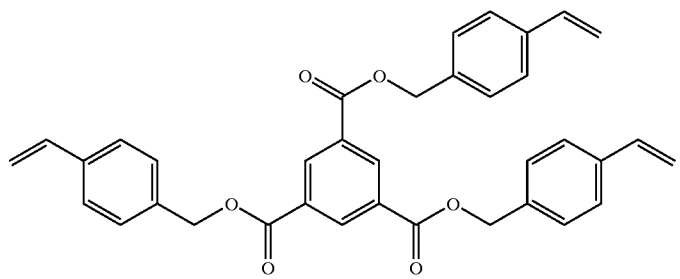
I-19

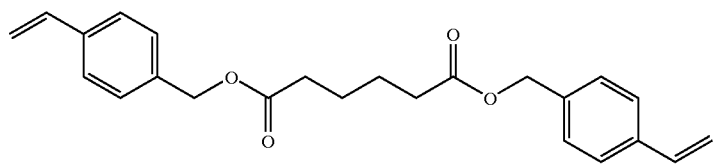
I-20

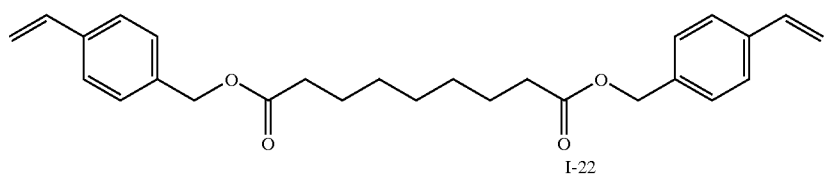
I-21

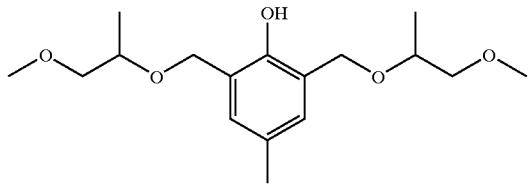
I-22

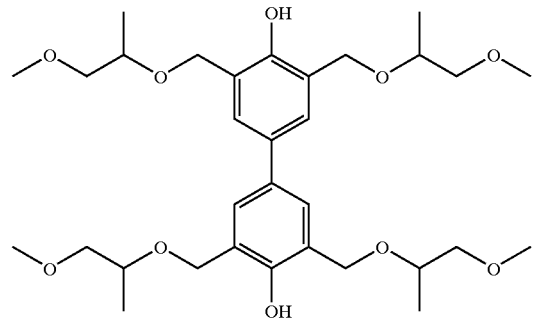
I-23

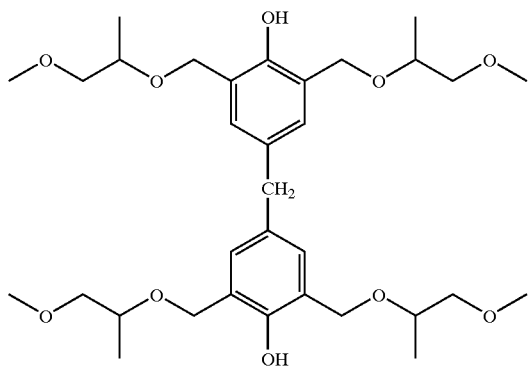
I-24

8. A positive image forming material according to claim 1, wherein said cross-linkable compound (C) is used alone or in combinations of two or more, and is added in an amount from 5 to 70% by weight, of the total weight of solid components in the image forming material.

9. A positive image forming material according to claim 1, wherein said cross-linkable compound (C) is added in an amount of 5 to 80% by weight, of the light and heat decomposition compound (B).

10. A positive image forming material according to claim 1, wherein said alkali-aqueous-solution-soluble polymer compound (A) is used alone or in combinations of two or more, and is added in an amount from 10 to 90% by weight, of the total weight of solid components in the positive image forming material.

11. A positive image forming material according to claim 1, wherein said light and heat decomposing compound (B) generates an acid when decomposed by light or heat.

12. A positive image forming material according to claim 11, wherein said compound which generates an acid when decomposed by light or heat is a compound represented by any of the following general formulae (1) to (7):

$$Ar^1—SO_2—SO_2—Ar^2 \quad \text{General formula (1)}$$

General formula (2)

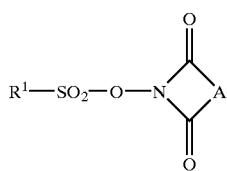

wherein, Ar¹ and Ar² each independently represents a substituted or unsubstituted aryl group, R¹ represents a substituted or unsubstituted alkyl group or aryl group, and A in the general formula (2) represents a substituted or unsubstituted alkylene group, alkenylene group or arylene group;

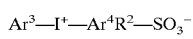      General formula (3)

General formula (4)

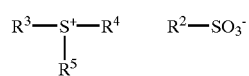

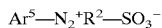      General formula (5)

wherein, $R^2$ represents a hydrocarbon group having 20 or less carbon atoms which may have a substituent, $Ar^3$, $Ar^4$ and $Ar^5$ each independently represents an aryl group having 20 or less carbon atoms which may have a substituent, $R^3$, $R^4$ and $R^5$ each independently represents a hydrocarbon group having 18 or less carbon atoms which may have a substituent, and $R^3$ and $R^4$ may bond with each other to form a ring;

General formula (6)

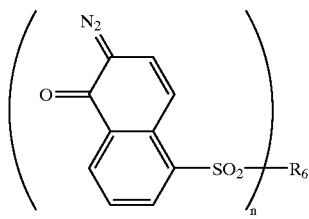

General formula (7)

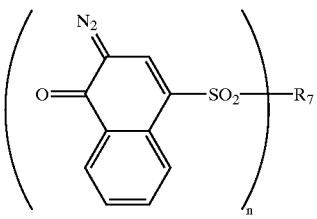

wherein, $R^6$ and $R^7$ each independently represents an organic group having a valency of one or more which may have a substituent, $R^6$ and $R^7$ are each connected with a sulfonyl portion by an ester or amide bond, and n in the general formulae (6) and (7) represents an integer of 1 or more.

13. A positive image forming material according to claim 1, wherein said light- and heat-decomposable substance (B) is added to the image forming material in an amount from 0.01 to 50% by weight, of the total weight of solid components in the image forming material.

14. A positive image forming material comprising

A: an alkali-aqueous-solution-soluble polymer compound having a phenolic hydroxyl group, B: a light and heat decomposing compound which suppresses alkali-aqueous-solution-solubility of said alkali-aqueous-solution-soluble polymer compound (A) having a phenolic hydroxyl group and is decomposed by light or heat to lose its alkali-aqueous-solution-solubility-suppressing effect on said compound (A), C: a compound which increases said solubility-suppressing effect of said compound (B) when used together with said component (B) in a composition containing the alkali-aqueous-solution-soluble polymer compound having a phenolic hydroxyl group (A), wherein said compound (C) contains in its molecule a hetero atom that can effect interaction including hydrogen bond formation and ionic interaction with both the alkali-aqueous-solution-soluble polymer compound (A) and said light and heat decomposing compound (B), thereby increasing said solubility-suppressing effect caused by said light and heat decomposing compound (B), and wherein said compound (C) has in its molecule two or more cross-linkable groups which are cross-linked with the alkali-aqueous-solution-soluble polymer compound (A) with heating, and wherein said cross-linkable group in said compound (C) conducts a cross-linking reaction with said alkali-aqueous-solution-soluble polymer compound (A) having a phenolic hydroxyl group when heated after alkali development, and due to this cross-linking in said compound (A), film strength of said compound (A) in a non-irradiated portion increases, and D: an infrared ray absorbing agent.

15. A positive image forming material according to claim 14, wherein said compound (C) has a substituent containing said hetero atom and exhibiting said interaction.

16. A positive image forming material according to claim 15, wherein said substituent is an ether bond, amide bond, sulfonamide bond, ester bond or hydroxyl group.

17. A positive image forming material according to claim 14, wherein said cross-linkable group is a condensation-cross-linkable substituent or a polymerizable substituent.

18. A positive image forming material according to claim 17, wherein said condensation-cross-linkable substituent is a substituted or unsubstituted hydroxymethyl group, a substituted or unsubstituted alkoxymethyl group or a substituted or unsubstituted aryloxymethyl group.

19. A positive image forming material according to claim 17, wherein said polymerizable substituent is a cation-polymerizable substituent.

20. A positive image forming material according to claim 14, wherein said cross-linkable compound (C) is a compound represented by one of the following structural formulae I-1 to I-24;

I-1

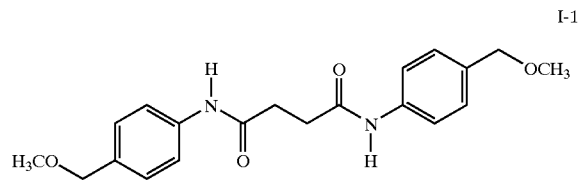

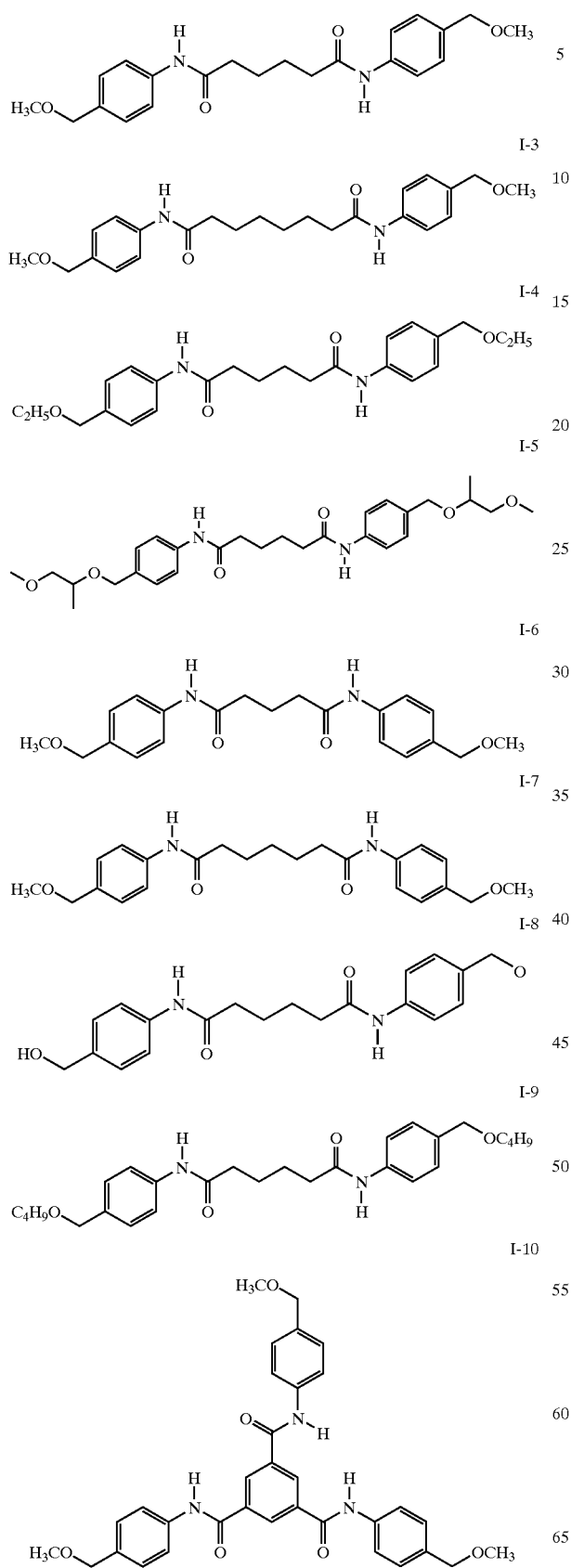
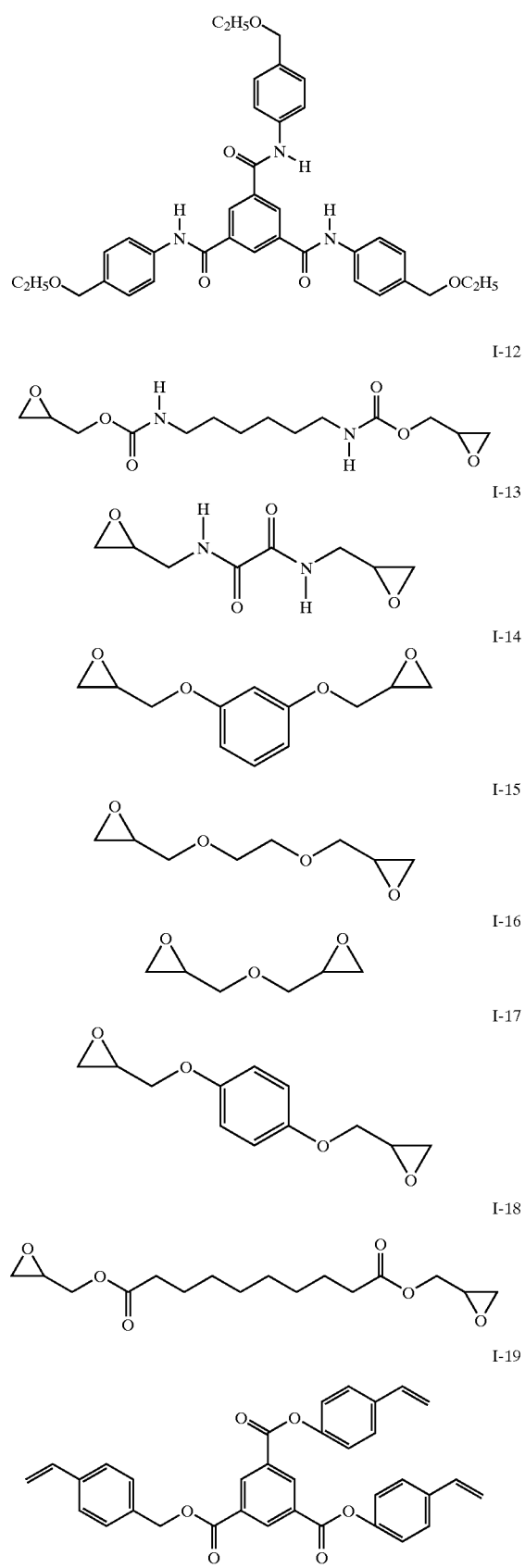

I-20
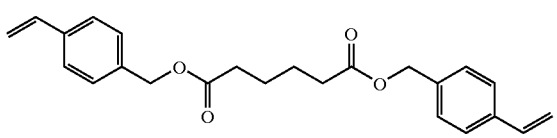

I-21
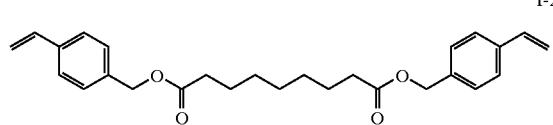

I-22
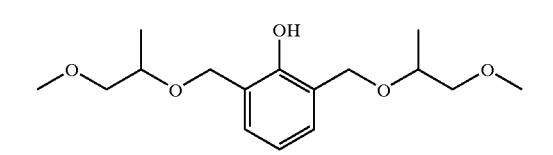

I-23
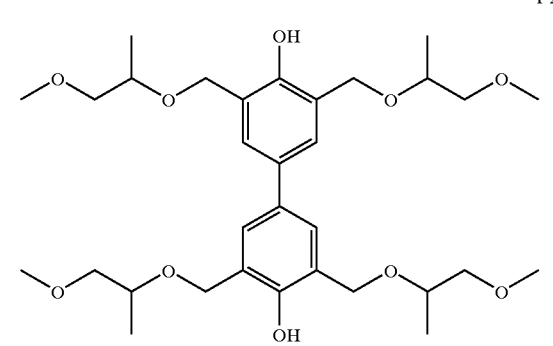

I-24
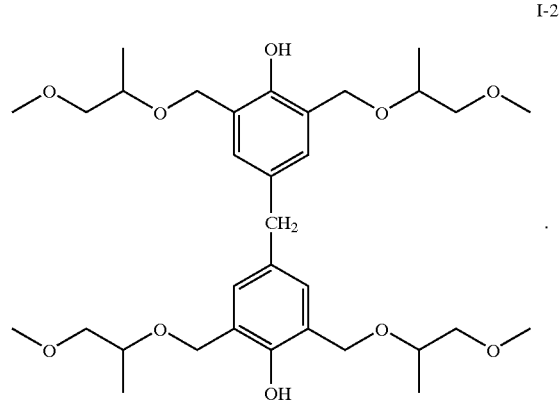

21. A positive image forming material according to claim 14, wherein said light and heat decomposing compound (B) generates an acid when decomposed by light or heat.

22. A positive image forming material according to claim 1, wherein the hetero atom contained in said crosslinkable compound (C) is nitrogen, oxygen, fluorine, chlorine or bromine.

23. A positive image forming material according to claim 22, wherein the hetero atom contained in said crosslinkable compound (C) is nitrogen or oxygen.

24. A positive image forming material according to claim 8, wherein said cross-linkable compound (C) is used alone or in combinations of two or more, and is added in an amount from 10 to 65% by weight, of the total weight of solid components in the image forming material.

25. A positive image forming material according to claim 10, wherein said alkali-aqueous-solution-soluble polymer compound (A) is used alone or in combinations of two or more, and is added in an amount from 20 to 85% by weight, of the total weight of solid components in the positive image forming material.

26. A positive image forming material according to claim 25, wherein said alkali-aqueous-solution-soluble polymer compound (A) is used alone or in combinations of two or more, and is added in an amount from 30 to 80% by weight, of the total weight of solid components in the positive image forming material.

27. A positive image forming material according to claim 12, wherein said compound which generates an acid when decomposed by light or heat is a diazonium salt or quinonediazide compound.

28. A positive image forming material according to claim 13, wherein said light- and heat-decomposable substance (B) is added to the image forming material in an amount from 0.1 to 25% by weight, of the total weight of solid components in the image forming material.

29. A positive image forming material according to claim 28, wherein said light- and heat-decomposable substance (B) is added to the image forming material in an amount from 0.5 to 20% by weight, of the total weight of solid components in the image forming material.

30. A positive image forming material according to claim 14, wherein the hetero atom contained in said compound (C) is nitrogen, oxygen, fluorine, chlorine or bromine.

31. A positive image forming material according to claim 30, wherein the hetero atom contained in said compound (D) is nitrogen or oxygen.

32. A positive image forming material according to claim 19, wherein said polymerizable substituent is an ethylenic double bond, epoxy group, vinyl ether group or radical-polymerizable substituent.

33. A positive image forming material according to claim 1, wherein said material is a planographic printing plate.

34. A positive image forming material according to claim 1, further comprising an aluminum support.

35. A positive image forming material according to claim 2, wherein said substituent is an amide bond, sulfonamide bond or ester bond.

* * * * *

UNITED STATES PATENT AND TRADEMARK OFFICE
CERTIFICATE OF CORRECTION

PATENT NO.    : 6,514,656 B1
DATED         : February 4, 2003
INVENTOR(S)   : Nakamura et al.

It is certified that error appears in the above-identified patent and that said Letters Patent is hereby corrected as shown below:

<u>Title page,</u>
Item [56], FOREIGN PATENT DOCUMENTS, please add
-- DATABASE WPI, Section Ch, Week 8345, Derwent Publications, Ltd., London, October 1983. --

Signed and Sealed this

Fifth Day of August, 2003

JAMES E. ROGAN
*Director of the United States Patent and Trademark Office*